(12) United States Patent
Nishimura

(10) Patent No.: US 7,679,188 B2
(45) Date of Patent: Mar. 16, 2010

(54) SEMICONDUCTOR DEVICE HAVING A BUMP FORMED OVER AN ELECTRODE PAD

(75) Inventor: Takao Nishimura, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 741 days.

(21) Appl. No.: 11/487,421

(22) Filed: Jul. 17, 2006

(65) Prior Publication Data

US 2007/0182019 A1    Aug. 9, 2007

(30) Foreign Application Priority Data

Feb. 6, 2006   (JP) .............................. 2006-028860

(51) Int. Cl.
*H01L 23/52* (2006.01)

(52) U.S. Cl. .................. 257/737; 257/777; 257/778; 257/780; 257/786; 257/E23.021; 257/E23.023

(58) Field of Classification Search ................ 257/773, 257/777, 778, 780, 786, E23.015, E23.02, 257/E23.021, E23.023, 737, 738
See application file for complete search history.

(56) References Cited

U.S. PATENT DOCUMENTS 7,078,331 B2 * 7/2006 Kwon et al. ................ 438/612

FOREIGN PATENT DOCUMENTS

| JP | 10-233401 A | 9/1998 |
|---|---|---|
| JP | 11-307581 A | 11/1999 |
| JP | 2000-286295 A | 10/2000 |
| JP | 2006-165310 A | 6/2006 |

OTHER PUBLICATIONS

"Japanese Office Action", Partial English-language translation, mailed Mar. 10, 2009 from JP Patent Office for corresponding JP App. No. 2006-028860.

* cited by examiner

*Primary Examiner*—Matthew E Warren
(74) *Attorney, Agent, or Firm*—Fujitsu Patent Center

(57) ABSTRACT

To provide a high-performance, highly-reliable semiconductor device in which an adhesive used to mount (e.g., flip-chip mount) a semiconductor chip on a substrate has less air bubbles, and a low-cost, efficient method for manufacturing the same. Semiconductor device 10 of the present invention includes semiconductor chip 11 having a plurality of electrode pads 12, and substrate 14 having a plurality of electrode terminals 15 at positions corresponding to electrode pads 12. A plurality of bumps 13, each composed of base part 13A and protruding part 13B having a diameter smaller than the diameter of base part 13A, is formed on at least one of electrode pads 12 in such a way that the respective base parts 13A of bumps 13 are in contact with each other, and semiconductor chip 11 is bonded to substrate 14 with adhesive 17 in a state where bumps 13 are electrically connected to electrode terminals 15.

8 Claims, 22 Drawing Sheets

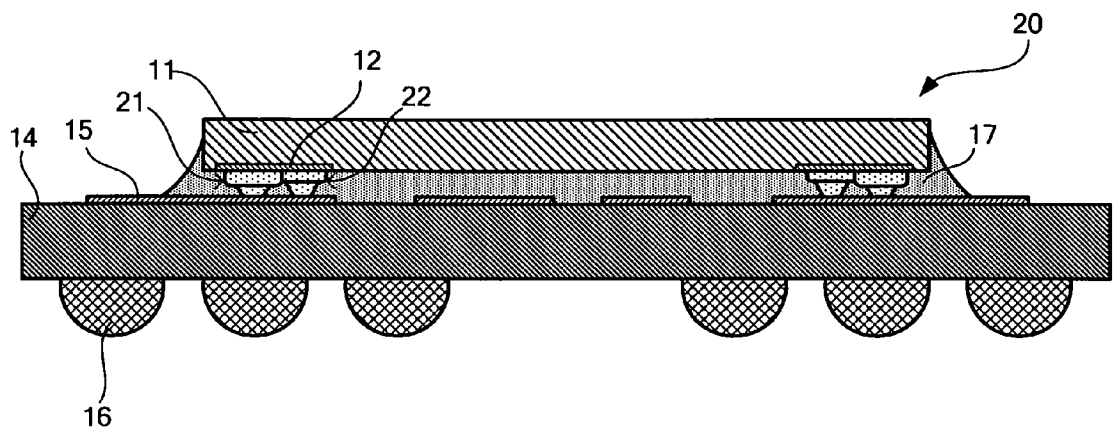
FIG. 8A
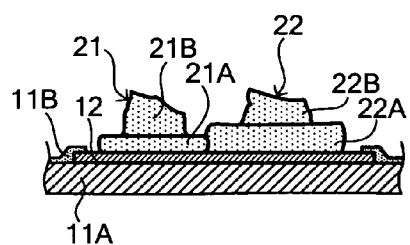
FIG. 8B
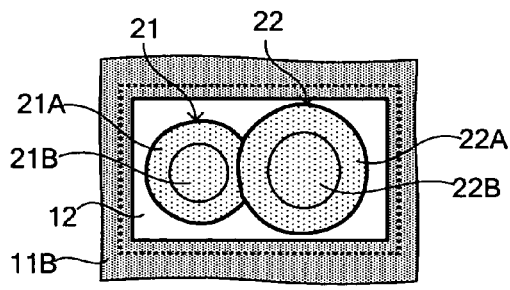

SEMICONDUCTOR DEVICE HAVING A BUMP FORMED OVER AN ELECTRODE PAD

CROSS-REFERENCE TO RELATED APPLICATIONS

This application is based upon and claims the benefits of the priority from the prior Japanese Patent Application No. 2006-028860 filed on Feb. 6, 2006, the entire contents of which are incorporated herein by reference.

BACKGROUND OF THE INVENTION

1. Field of the Invention

The present invention relates to a high-performance, highly-reliable semiconductor device in which an adhesive used to mount (e.g., flip-chip mount) a semiconductor chip on a substrate has less air bubbles therein, and to a low-cost, efficient method for manufacturing the semiconductor device.

2. Description of the Related Art

Flip chip mounting has conventionally been utilized as a method for mounting a semiconductor chip on a substrate, because it can simply the manufacturing process and thus can realize short time, low cost semiconductor mounting. The following, for example, is a known flip chip mounting method: An adhesive is previously supplied to the substrate, convex bumps made of, for example, gold or copper are formed on the electrode pads of the semiconductor chip, the semiconductor chip is mounted face down on the substrate to allow its bumps to face the corresponding electrode terminals of the substrate, a load is applied to the semiconductor chip to allow the bumps to be electrically connected to the electrode terminals, and the adhesive is cured. In this way the semiconductor chip is connected (mounted) on the substrate.

Since bumps can be readily formed with such a mounting method, it is possible to realize low-cost manufacturing of a low-profile semiconductor device in which a semiconductor chip that has a relatively small number of electrode pads—from several tens to several hundreds—is used. For this reason, flip chip mounting is widely applied to digital household electrical appliances such as cellular phones, digital still cameras, and flash memories.

In the flip chip mounting method the convex bumps are referred to as "stud bumps", each composed of a base part and a protruding part on the base part. With a so-called ball bonding process using a metal wire made of, for example gold or copper, metal balls are secured to the electrode pads of the semiconductor chip by a pressure welding process or pressure welding process using ultrasonic. Note that the protruding part on the base part may be subjected to a planarizing process on an as-needed basis for planarization.

The adhesive is referred to as an underfill material, and is charged in the clearance between the semiconductor chip and the substrate. For the adhesive, for example, insulating adhesives made of epoxy resin, and anisotropic conductive adhesives obtained by adding conductive particles in insulating resins such as epoxy resins are used. The semiconductor chip and the substrate can be bonded together by curing the adhesive, ensuring electrical connection between the bumps of the semiconductor chip and the electrical terminals of the substrate. In addition, sealing the connections between the bumps and electrical terminals as well as circuit elements of the semiconductor chip provides protection to them. The charging of the adhesive may be carried out by previously placing it between the semiconductor chip and the semiconductor substrate upon flip chip mounting as described above, or may be carried out by injecting it in the clearance between the semiconductor chip and the semiconductor substrate after electrically connecting the bumps to the electrode terminals with a flip chip mounting method.

Incidentally, along with the recent demand for downsizing of semiconductor devices and greater packaging density, the size of the electrode pads of the semiconductor chip and electrode pad pitch have been increasingly reduced for the purpose of reducing semiconductor chip size or increasing the number of electrode pads of the semiconductor chip. Accordingly, a semiconductor device manufactured with the flip chip mounting method also has fine bumps on electrode pads when both the size of the electrode pads and electrode pitch are reduced.

Fine bumps, however, cause reduction in the contact area of one electrical connection, and stress concentration on that electrical connection, which is caused due to the difference in thermal coefficient between the semiconductor chip and semiconductor substrate, becomes prominent. For this reason, rupture may take place at the electrical connections when the semiconductor chip is flip-chip mounted on the substrate and, even when rupture has not taken place at this point, residual stress may be concentrated on the electrical connections, resulting in reduction in the reliability of a finished semiconductor device itself.

To avoid this problem, semiconductor devices have been proposed in which a semiconductor chip having a plurality of stud bumps formed on each electrode pad is mounted face down on a substrate to improve reliability of electrical connections (see Japanese Patent Application Laid-Open (JP-A) No. 10-233401, 11-307581, and 2000-286295). Such semiconductor devices offer improved reliability at connections because stress exerted on one connection can be dispersed.

The formation of fine bumps requires use of a metal wire with a smaller diameter. However, as the wire diameter decreases, so too does the diameter of balls that are used in a ball bonding process and the height of bumps to be formed. Thus, when a semiconductor chip is mounted on a substrate, the clearance formed between them becomes small, leading to a reduction in the fluidity of the adhesive injected therein during or after the flip chip mounting. For this reason, air bubbles generated as a result of flow of the adhesive are not fully removed to the outside of the semiconductor chip; they are entrapped in the adhesive. In particular, it is likely that air bubbles are entrapped in the adhesive in the vicinity of bump connections because fine concave and convex shapes are formed there, making it extremely difficult to charge the adhesive in the clearance without inclusion of air bubbles. For example, when a plurality of fine stud bumps are formed on each electrode as in the case of the semiconductor devices disclosed in Japanese Patent Application Laid-Open JP-A) No. 10-233401, 11-307581, and 2000-286295, the space between adjacent stud bumps (in particular the space between adjacent base parts of the stud bumps) becomes very small. Thus, this problem becomes more prominent in such semiconductor devices. When the semiconductor device is mounted on a mother board or the like by reflow soldering, moisture in air bubbles entrapped in the adhesive cause an explosion to cause bulge and/or peeling off of the adhesive, triggering electrical continuity failure at the bump connections in some cases. Moreover, when air bubbles are present in the vicinity of the bump connections, moisture and/or impurities (e.g., ions) in the air bubbles cause current leakage between the adjacent bumps, leading to a reduction in the characteristics of the semiconductor device and to semiconductor device malfunction in some cases. Thus, air bubbles entrapped in an adhesive adversely affects the reliability of the semiconductor device.

A high-performance, highly-reliable semiconductor device in which an adhesive used to mount (e.g., flip-chip mount) a semiconductor chip on a substrate has less air bubbles therein, and a low-cost, efficient method for manufacturing the semiconductor device have yet been provided. In particular, there is a demand for the development of a technology that can reduce air bubbles in the adhesive in a semiconductor chip having minute bumps at a narrow bump pitch.

It is an object of the present invention to solve the foregoing problems and to achieve the object described below. Specifically, it is an object of the present invention to provide a high-performance, highly-reliable semiconductor device in which an adhesive used to mount (e.g., flip-chip mount) a semiconductor chip on a substrate has less air bubbles therein, and a low-cost, efficient method for manufacturing the semiconductor device.

SUMMARY OF THE INVENTION

The following is the means for solving the foregoing problems.

The semiconductor device of the present invention includes a semiconductor chip having a plurality of electrode pads disposed thereon; and a substrate having a plurality of electrode terminals at positions corresponding to the electrode pads, wherein a plurality of bumps, each composed of a base part and a protruding part having a diameter smaller than the diameter of the base part, is formed on at least one of the electrode pads in such a way that the respective base parts of the bumps are in contact with each other, and wherein the semiconductor chip is bonded to the substrate with an adhesive in a state where the bumps are electrically connected to the electrode terminals.

In the semiconductor device the plurality of bumps are formed on at least one of the plurality of electrode pads, making it possible to disperse stress exerted on one bump connection and to prevent rupture of the connection due to stress concentration. Moreover, the bumps are so formed that the respective base parts are in contact with each other. For this reason, when the semiconductor chip is mounted (e.g., flip-chip mounted) on the substrate with an adhesive, air bubbles entrapped in the adhesive are reduced, preventing the occurrence of electrical continuity failure at the bump connections caused due to bulge and/or peeling off of the adhesive and current leakage between adjacent bumps caused due to moisture and/or impurities (e.g., ions) entrapped in the air bubbles. Thus, the semiconductor device of the present invention is of high performance and high reliability.

The method of the present invention for manufacturing a semiconductor device includes: forming a plurality of bumps, each composed of a base part and a protruding part having a diameter smaller than the diameter of the base part, on at least one of a plurality of electrode pads formed on a semiconductor chip, so that the respective base parts of the bumps are in contact with each other; arranging the semiconductor chip to face a substrate which has a plurality of electrode terminals at positions corresponding to the electrode pads of the semiconductor chip, to thereby electrically connect the bumps to the electrode terminals by allowing the bumps to contact the electrode terminals; and supplying an adhesive between the semiconductor chip and the substrate to bond the semiconductor chip to the substrate.

In the bump formation step the plurality of bumps are formed on at least one of the plurality of the electrode pads of the semiconductor chip in such a way that the respective base parts are in contact with each other. In the bump connection step the semiconductor chip is arranged to face the substrate, and the bumps are electrically connected to the electrode terminals by allowing the bumps to contact the electrode terminals. In the adhesive supplying step the adhesive is provided between the semiconductor chip and the substrate. In this way the semiconductor chip and the substrate are bonded together. Thus, it is possible to disperse stress exerted on one bump connection and to prevent rupture of the connection due to stress concentration. Moreover, when the semiconductor chip is mounted (e.g., flip-chip mounted) on the substrate, air bubbles entrapped in the adhesive are reduced in the vicinity of the interface between the adhesive and the substrate. Thus, with this method, it is possible to manufacture a high-performance, highly reliable semiconductor device efficiently.

BRIEF DESCRIPTION OF THE DRAWINGS

FIG. 7 is a vertical cross-sectional view of an example of the semiconductor device of the present invention, showing the Second Example (Example 2).

FIG. 8A is an enlarged vertical cross-sectional view of the vicinities of bumps used in the Second Example (Example 2) of the semiconductor device of the present invention.

FIG. 8B is an enlarged top view of the vicinities of bumps used in the Second Example (Example 2) of the semiconductor device of the present invention.

DESCRIPTION OF THE PREFERRED EMBODIMENTS

Hereinafter, the semiconductor device of the present invention and the manufacturing method for the same will be described with reference to Examples, which however shall not be construed as limiting the invention thereto.

Example 1

Figure 1:
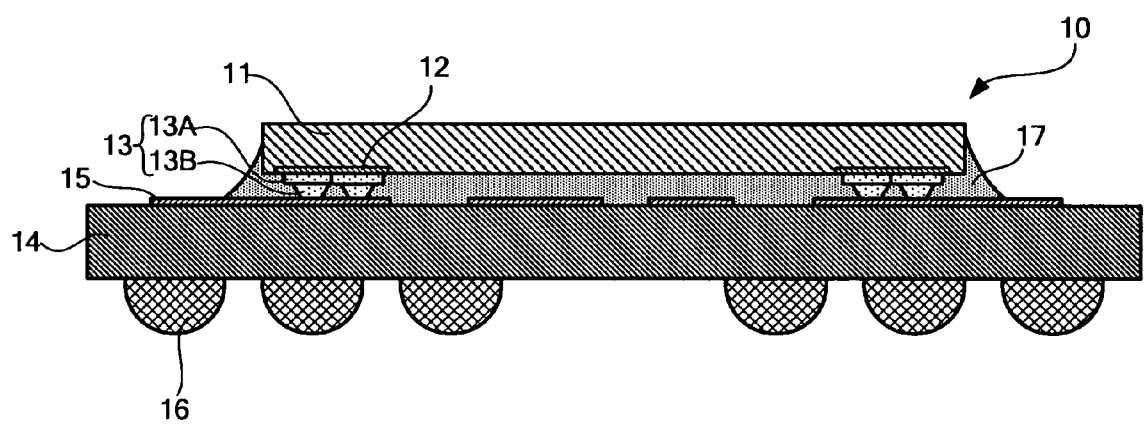
FIG. 1 is a vertical cross-sectional view of an example of a semiconductor device of the present invention, showing the First Example (Example 1).

The First Example of the semiconductor device of the present invention is shown in FIG. 1, which is a vertical cross-sectional view of the semiconductor device.

The semiconductor device 10 shown in FIG. 1 is made of, for example, organic material such as glass epoxy, glass BT and polyimide, ceramics, or glass. An interconnection layer made of, for example Cu, is formed on the surface of a substrate 14, and a semiconductor chip 11 is fixed to the substrate 14 by use of an adhesive 17.

A plurality of electrode pads 12 is formed on the semiconductor chip 11, and a plurality of bumps 13 are formed on at least one of the electrode pads 12.

Figure 2A:
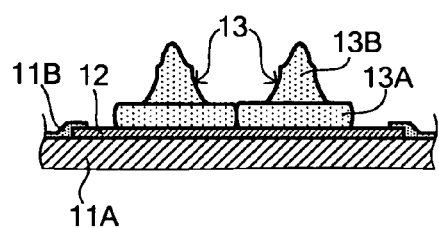
FIG. 2A is an enlarged vertical cross-sectional view of the vicinities of bumps used in the First Example (Example 1) of the semiconductor device of the present invention.
Figure 2B:
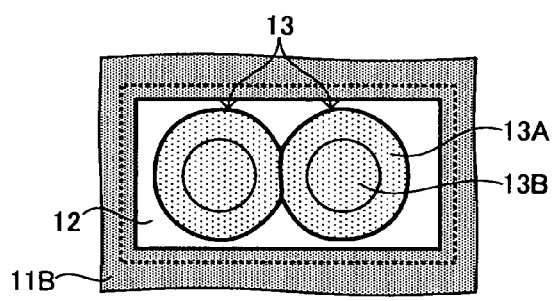
FIG. 2B is an enlarged top view of the vicinities of bumps used in the First Example (Example 1) of the semiconductor device of the present invention.

The enlarged view of the vicinities of the bumps 13 used in the semiconductor device 10 shown in FIG. 1, and the top view thereof are shown in FIGS. 2A and 2B, respectively. As shown in FIG. 2A, two bumps 13 are formed in the opening of a surface protective layer 11B of an electrode pad 12 which is formed on a semiconductor substrate 11A such as a silicon substrate. Note in FIG. 2A that other layers provided on the semiconductor substrate 11A, such as a conductive layer and insulating layer, are not shown.

The constituent materials, shape, structure, size and the like of the electrode pad 12 are not particularly limited, and can be appropriately determined depending on the intended purpose. Examples of the constituent materials include Al, Cu, and alloys of Al and Cu (e.g., an Al (95%)-Cu (5%) alloy). The electrode pad 12 pitch is, for example, 40 μm. The size of the opening of the surface protective layer 11B of the electrode pad 12 is 34×74 μm. In addition, examples of the surface protective layer 11B include an insulating layer formed of a $SiN/SiO_2$ double-layer.

As shown in FIGS. 2A and 2B, each bump 13 is composed of a base part 13A and a protruding part 13B which is provided on the base part 13A and has a diameter smaller than that of the base part 13A. The two bumps 13 are formed on the electrode pad 12 so that their respective base parts 13A are in contact with each other.

The constituent materials, shape, structure, size, height (thickness) and the like of the bump 13 are not particularly limited, and can be appropriately determined depending on the intended purpose. Examples of the constituent materials include Au, Al, Cu, and alloys thereof. The size of the bump 13 is preferably such that the diameter of the base part 13A is 28 μm to 34 μm and the diameter of the protruding part 13B is 18 μm to 28 μm. In addition, the height (thickness) of the bump 13 is preferably such that the height (thickness) of the base part 13A is 6 μm to 10 μm and the height (thickness) of the protruding part 13B is 20 μm to 70 μm.

The number of the bumps 13 is not particularly limited as long as it is 2 or more, and can be appropriately determined depending on, for example, the size of the electrode pads 12.

Meanwhile, as shown in FIG. 1, a plurality of electrode terminals 15 are formed on the main (front) surface of the substrate 14 at positions corresponding to the electrode pads 12 of the semiconductor chip 11, and a plurality of solder balls 16 is formed on the back surface as external terminals. For example, an adhesive 17 made of epoxy resin or the like is charged in the clearance formed between the semiconductor chip 11 and the substrate 14 in a state where the protruding parts 13B of the bumps 13 and the electrode terminals are electrically connected together. In this way the semiconductor chip 11 and the substrate 14 are bonded together.

The adhesive 17 is not particularly limited and can be appropriately selected depending on the intended purpose; examples include anisotropic conductive adhesives and insulating adhesives made of epoxy resin.

No gap is formed between the bumps 13 in this Example because they are formed on the electrode pad 12 so that their respective base parts 13A are in contact with each other, thereby reducing air bubbles in the adhesive 17 when the semiconductor chip 11 is mounted (e.g., flip-chip mounted) on the substrate 14 by use of the adhesive 17. This in turn prevents the occurrence of electrical continuity failure at the bump connections caused due to bulge and/or peeling off of the adhesive and current leakage between adjacent bumps caused due to moisture and/or impurities (e.g., ions) entrapped in the air bubbles. Thus, the semiconductor device 10 of this Example is of high performance and high reliability.

Figure 3A:
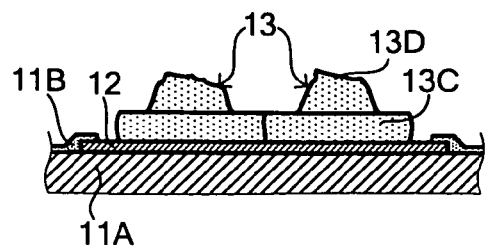
FIG. 3A is a vertical cross-sectional view of a modified example of the vicinities of bumps used in the First Example (Example 1) of the semiconductor device of the present invention.
Figure 3B:
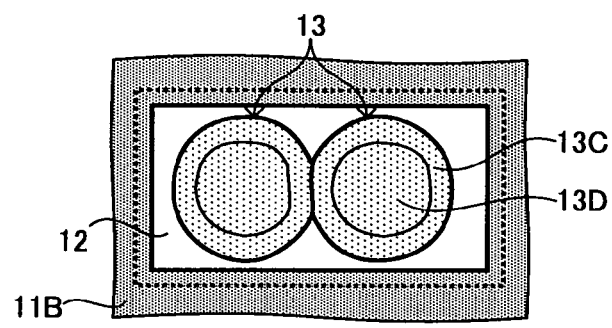
FIG. 3B is a top view of the modified example of the vicinities of bumps used in the First Example (Example 1) of the semiconductor device of the present invention.
Figure 4A:
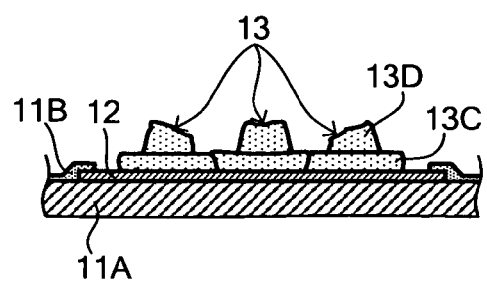
FIG. 4A is a vertical cross-sectional view of another modified example of the vicinities of bumps used in the First Example (Example 1) of the semiconductor device of the present invention.
Figure 4B:
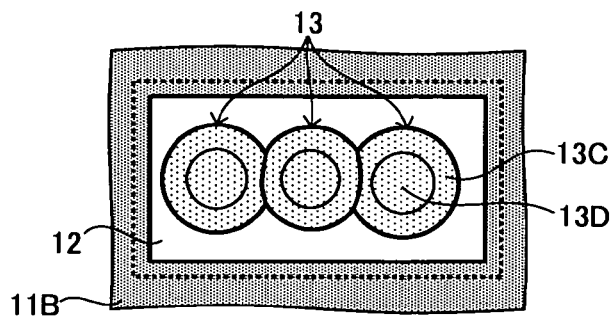
FIG. 4B is a top view of another modified example of the vicinities of bumps used in the First Example (Example 1) of the semiconductor device of the present invention.

A modification can be made to the bumps 13 of the semiconductor device 10 of Example 1, as will be demonstrated below. As shown in FIG. 3A, the top of the protruding part 13D of the bump 13 may be crushed so that its diameter is greater than that of the protruding part 13B of the bump 13 shown in FIG. 2B, as shown in FIG. 3B. In addition, three bumps 13 may be provided on the electrode pad 12 as shown in FIG. 4A. As shown in FIG. 4B, the three bumps 13 may be aligned in a row so that their respective base parts 13C are connected together. Note that FIGS. 3A and 4A each shows an enlarged view of a modified example of the bumps 13 used in the semiconductor device shown in FIG. 1 and that FIGS. 3B and 4B are top views of FIGS. 3A and 4A, respectively.

Next, an example of the method for forming the bumps 13 shown in FIGS. 2A and 2B will be described with reference to the drawings (this method is equivalent to the bump formation step in the method of the present invention for manufacturing a semiconductor device).

Figure 5A:
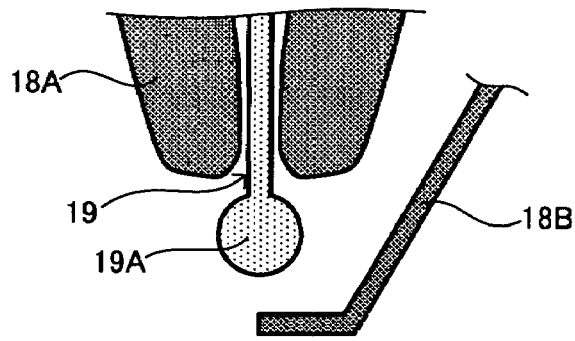
FIG. 5A is a first cross-sectional view for explaining an example of a bump formation step in a manufacturing method for the semiconductor device of the First Example (Example 1) of the present invention.
Figure 5B:
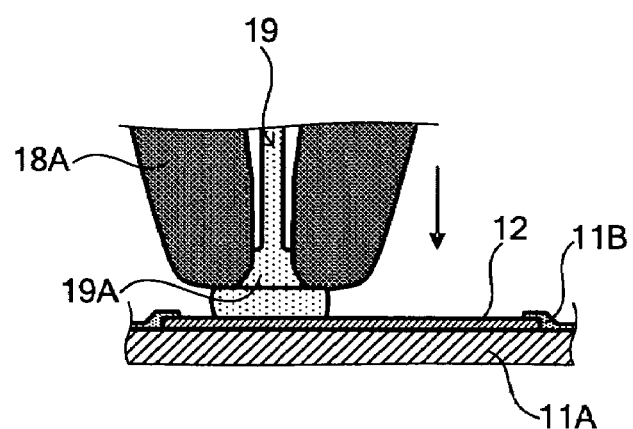
FIG. 5B is a second cross-sectional view for explaining the example of the bump formation step in the manufacturing method for the semiconductor device of the First Example (Example 1) of the present invention.
Figure 5C:
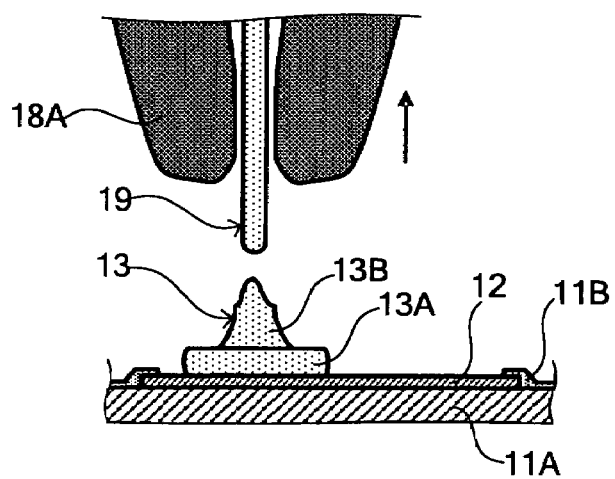
FIG. 5C is a third cross-sectional view for explaining the example of the bump formation step in the manufacturing method for the semiconductor device of the First Example (Example 1) of the present invention.
Figure 5D:
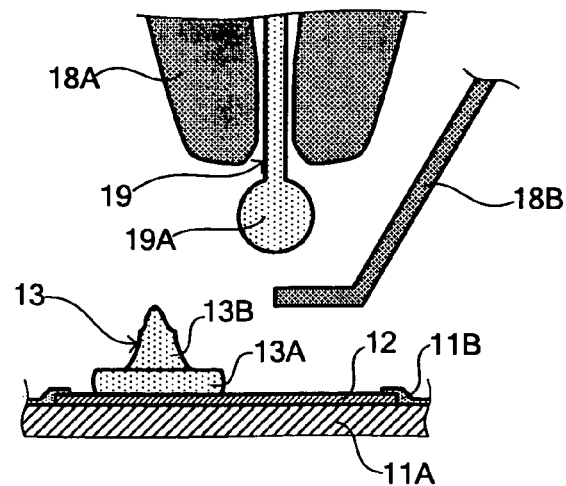
FIG. 5D is a fourth cross-sectional view for explaining the example of the bump formation step in the manufacturing method for the semiconductor device of the First Example (Example 1) of the present invention.
Figure 5E:
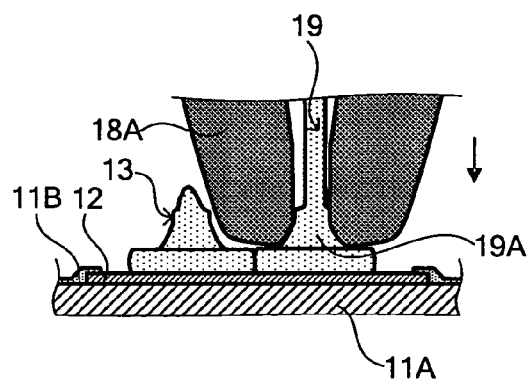
FIG. 5E is a fifth cross-sectional view for explaining the example of the bump formation step in the manufacturing method for the semiconductor device of the First Example (Example 1) of the present invention.
Figure 5F:
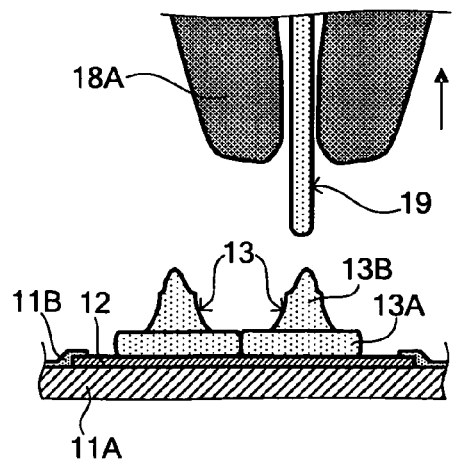
FIG. 5F is a sixth cross-sectional view for explaining the example of the bump formation step in the manufacturing method for the semiconductor device of the First Example (Example 1) of the present invention.

The bumps 13 can be formed through a ball bonding process using a metal wire. To be more specific, as shown in FIG. 5A, the tip of a metal wire 19 of 18 μm in diameter, which is extended out of a bonding capillary 18A, is melted into a ball shape by the application of high-voltage spark using a torch electrode 18B, thereby forming a ball part 19A. As shown in FIG. 5B, the ball part 19A is then brought in contact with the electrode pad 12 at the opening of the surface protective layer 11B, followed by application of a load and ultrasonic to the ball part 19A by means of the bonding capillary 18A. Thereafter, as shown in FIG. 5C, the bonding capillary 18A is vertically lifted, breaking the metal wire 19 to form the first bump 13 which is composed of the base part 13A and protruding part 13B. With a similar process, another ball part 19A is formed at the tip of the metal wire 19 as shown in FIG. 5D and, as shown in FIG. 5E, is placed on the electrode pad 12 in such a way as to be partially in contact with the perimeter of the base part 13A of the first bump 13, followed by application of a load and ultrasonic to the ball part 19A by means of the bonding capillary 18A. Thereafter, as shown in FIG. 5F, the bonding capillary 18A is vertically lifted, breaking the metal wire 19 to form the second bump 13 which is composed of the base part 13A and protruding part 13B. In this way two bumps 13 can be obtained that are arranged in a layout shown in FIGS. 2A and 2B.

Note that the diameter of the metal wire 19 is not particularly limited and can be appropriately determined depending on the diameter of bumps to be formed.

Next, an example of the method for forming the bumps 13 shown in FIGS. 3A and 3B will be described with reference to the drawings (this method is equivalent to the bump formation step in the method of the present invention for manufacturing a semiconductor device).

Figure 6A:
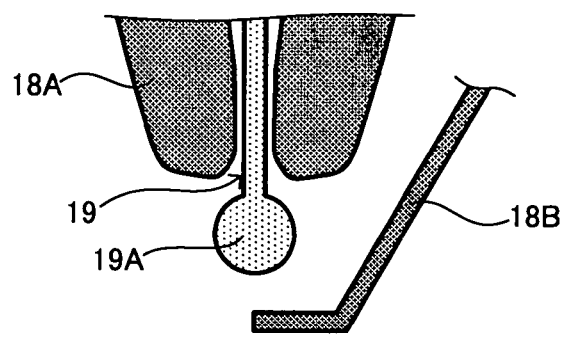
FIG. 6A is a first cross-sectional view for explaining another example of the bump formation step in the manufacturing method for the semiconductor device of the First Example (Example 1) of the present invention.
Figure 6B:
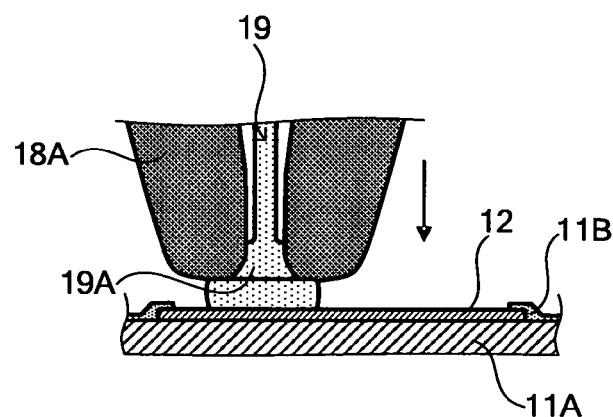
FIG. 6B is a second cross-sectional view for explaining another example of the bump formation step in the manufacturing method for the semiconductor device of the First Example (Example 1) of the present invention.
Figure 6C:
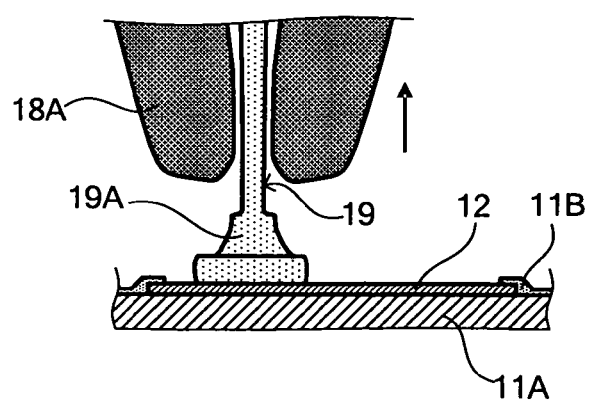
FIG. 6C is a third cross-sectional view for explaining another example of the bump formation step in the manufacturing method for the semiconductor device of the First Example (Example 1) of the present invention.
Figure 6D:
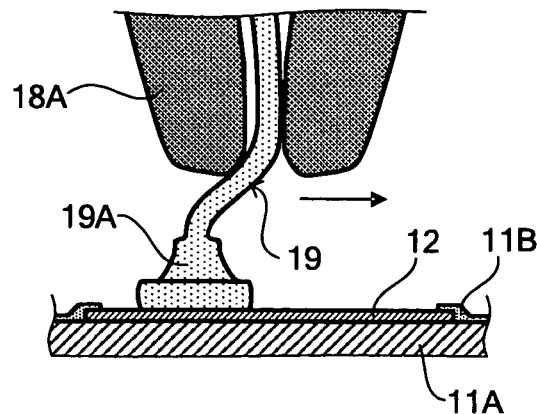
FIG. 6D is a fourth cross-sectional view for explaining another example of the bump formation step in the manufacturing method for the semiconductor device of the First Example (Example 1) of the present invention.
Figure 6E:
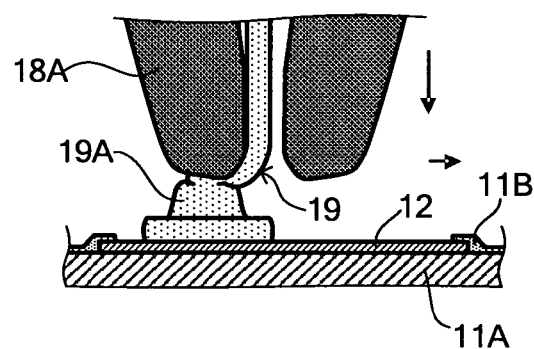
FIG. 6E is a fifth cross-sectional view for explaining another example of the bump formation step in the manufacturing method for the semiconductor device of the First Example (Example 1) of the present invention.
Figure 6F:
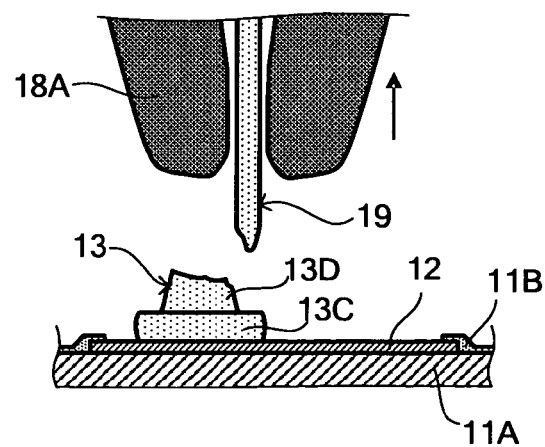
FIG. 6F is a sixth cross-sectional view for explaining another example of the bump formation step in the manufacturing method for the semiconductor device of the First Example (Example 1) of the present invention.
Figure 6G:
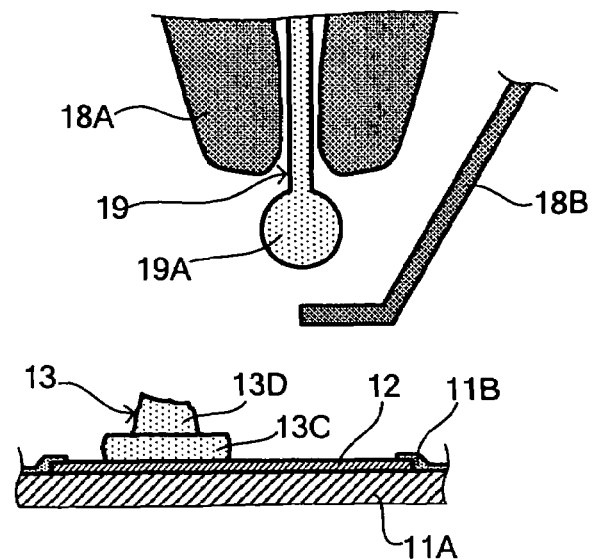
FIG. 6G is a seventh cross-sectional view for explaining another example of the bump formation step in the manufacturing method for the semiconductor device of the First Example (Example 1) of the present invention.
Figure 6H:
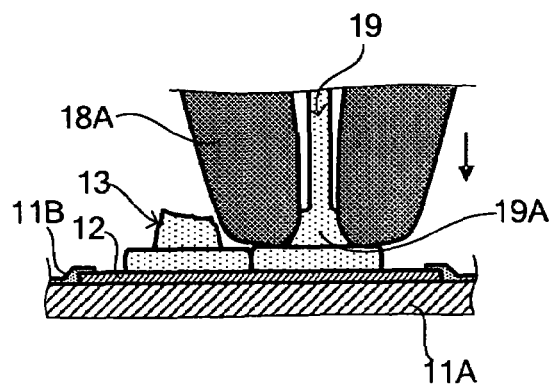
FIG. 6H is an eighth cross-sectional view for explaining another example of the bump formation step in the manufacturing method for the semiconductor device of the First Example (Example 1) of the present invention.
Figure 6I:
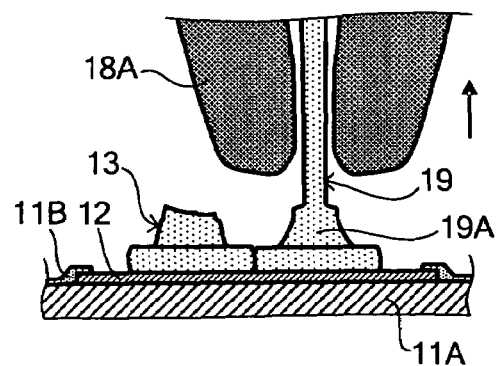
FIG. 6I is a ninth cross-sectional view for explaining another example of the bump formation step in the manufacturing method for the semiconductor device of the First Example (Example 1) of the present invention.
Figure 6J:
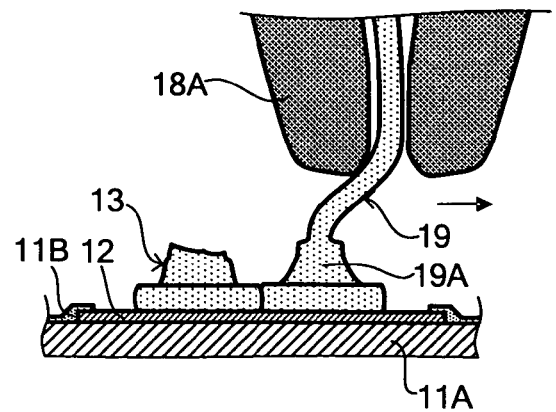
FIG. 6J is a tenth cross-sectional view for explaining another example of the bump formation step in the manufacturing method for the semiconductor device of the First Example (Example 1) of the present invention.
Figure 6K:
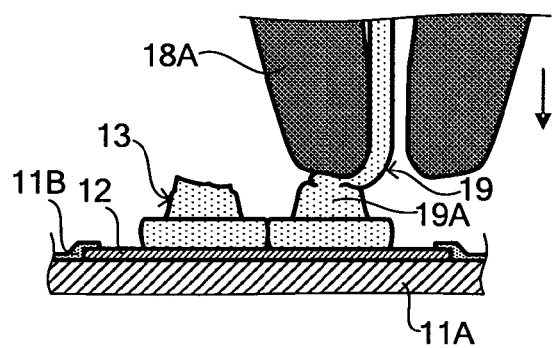
FIG. 6K is an eleventh cross-sectional view for explaining another example of the bump formation step in the manufacturing method for the semiconductor device of the First Example (Example 1) of the present invention.
Figure 6L:
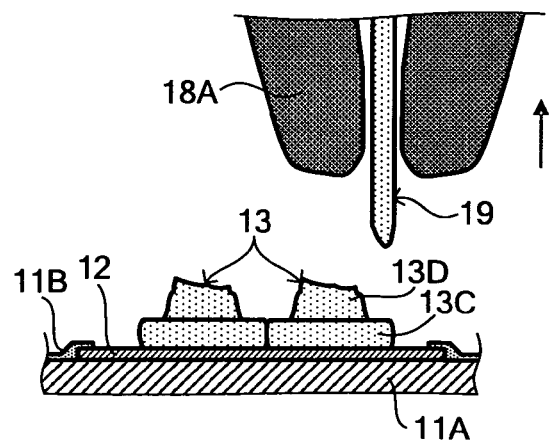
FIG. 6L is a twelfth cross-sectional view for explaining another example of the bump formation step in the manufacturing method for the semiconductor device of the First Example (Example 1) of the present invention.

As described above, the bumps 13 can be formed through a ball bonding process using a metal wire. To be more specific, as shown in FIG. 6A, the tip of the metal wire 19 of 18 μm in diameter, which is extended out of the bonding capillary 18A, is melted into a ball shape by the application of high-voltage spark using the torch electrode 18B, thereby forming a ball part 19A. As shown in FIG. 6B, the ball part 19A is then brought in contact with an electrode pad 12 at the opening of the surface protective layer 11B, followed by application of a load and ultrasonic to the ball part 19A by means of the bonding capillary 18A. After vertically lifting the bonding capillary 18A as shown in FIG. 6C, the bonding capillary 18A is moved in a direction horizontal to the surface of the semiconductor substrate 11A as shown in FIG. 6D. The top of the ball part 19A is then crushed by the bonding capillary 18A as shown in FIG. 6E, and the bonding capillary 18A is again moved in a direction horizontal to the surface of the semiconductor substrate 11A. As shown in FIG. 6F, the bonding capillary 18A is vertically lifted to break the metal wire 19, forming the first bump 13 which is composed of the base part 13C and protruding part 13D. With a similar process, another ball part 19A is formed at the tip of the metal wire 19 as shown in FIG. 6G and, as shown in FIG. 6H, is placed on the electrode pad 12 in such a way as to be partially in contact with the perimeter of the base part 13C of the first bump 13. After vertically lifting the bonding capillary 18A as shown in FIG. 6I, the bonding capillary 18A is moved in a direction horizontal to the surface of the semiconductor substrate 11A as shown in FIG. 6J. The top of the ball part 19A is then crushed by the bonding capillary 18A as shown in FIG. 6K and, as shown in FIG. 6L, the bonding capillary 18A is vertically lifted to break the metal wire 19, forming the second bump 13 which is composed of the base part 13C and protruding part 13D. By pushing down the top of the protruding parts 13D in this way, it is possible to prevent the protruding parts 13D of the first bump 13 from being in contact with the bonding capillary 18A upon formation of bumps 13 that are connected together.

Note that the bumps 13 shown in FIGS. 4A and 4B can be formed with a method similar to that used for forming the bumps 13 shown in FIGS. 3A and 3B.

As described above, upon formation of the second bump 13, the ball part 19A of the metal wire 19 may be placed on the electrode pad 12 so as to be in contact with the base part 13A (or 13C) of the first bump 13. Alternatively, the base part 13A (or 13C) of the first bump 13 and the base part 13A (or 13C) of the second bump 13 may be in contact with each other by placing the ball part 19A on the electrode pad 12 so as not to be in contact with the base part 13A (or 13C) of the first bump 13 and by deforming the ball part 19A by pushing down its top.

Example 2

The Second Example of the semiconductor device of the present invention is shown in FIG. 7, which is a vertical cross-sectional view of the semiconductor device.

A semiconductor device 20 shown in FIG. 7 is the semiconductor device 10 shown in FIG. 1, where the base part of one of the two bumps formed on the electrode pad 12 is different in height from the base part of the other bump.

The enlarged view of the vicinities of the bumps used in the semiconductor device 20 shown in FIG. 7, and the top view thereof are shown in FIGS. 8A and 8B, respectively. As shown in FIG. 8A, two different bumps 21 and 22 are formed in the opening of a surface protective layer 11B of an electrode pad 12 which is formed on a semiconductor substrate 11A such as a silicon substrate. Note in FIG. 8A that other layers provided on the semiconductor substrate 11A, such as a conductive layer and insulating layer, are not shown.

As shown in FIGS. 8A and 8B, the bump 21 is composed of a base part 21A and a protruding part 21B which is smaller in diameter than the base part 21A, and the bump 22 is composed of a base part 22A which is larger in height and diameter than the base part 21A and a protruding part 22B which is smaller in diameter than the base part 22A. The two bumps 21 and 22 are formed on the electrode pad 12 so that the respective base parts 21A and 22A are in contact with each other.

Next, an example of the method for forming the bumps 21 and 22 shown in FIGS. 8A and 8B will be described with reference to the drawings (this method is equivalent to the bump formation step in the method of the present invention for manufacturing a semiconductor device).

Figure 9A:
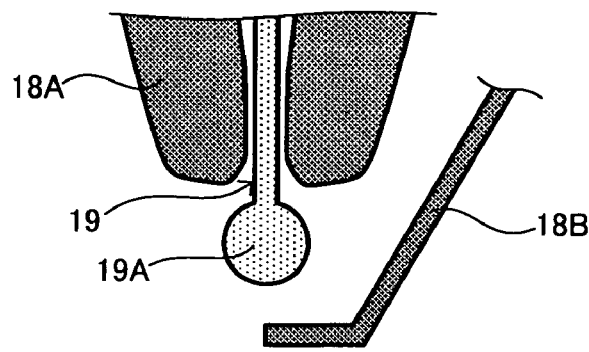
FIG. 9A is a first cross-sectional view for explaining an example of a bump formation step in a manufacturing method for the semiconductor device of the Second Example (Example 2) of the present invention.
Figure 9B:
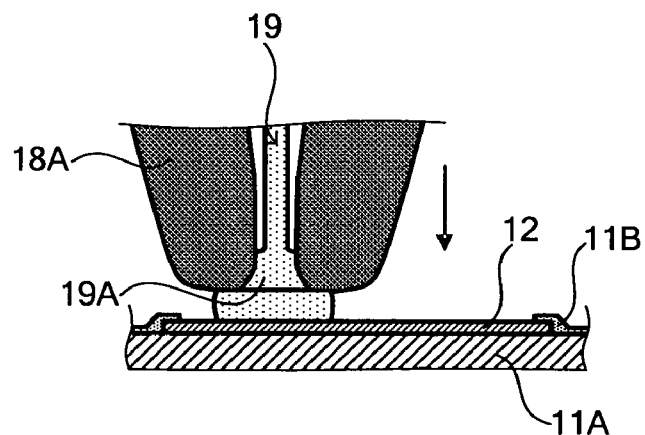
FIG. 9B is a second cross-sectional view for explaining the example of the bump formation step in the manufacturing method for the semiconductor device of the Second Example (Example 2) of the present invention.
Figure 9C:
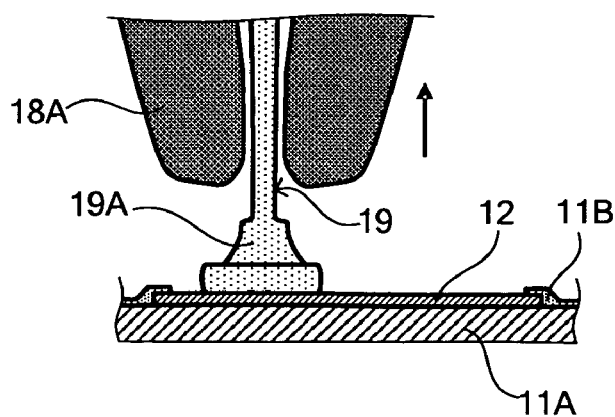
FIG. 9C is a third cross-sectional view for explaining the example of the bump formation step in the manufacturing method for the semiconductor device of the Second Example (Example 2) of the present invention.
Figure 9D:
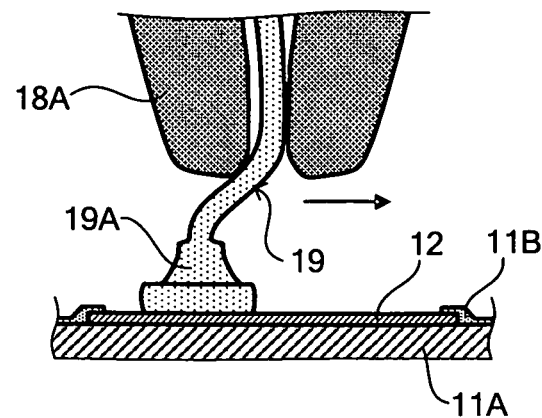
FIG. 9D is a fourth cross-sectional view for explaining the example of the bump formation step in the manufacturing method for the semiconductor device of the Second Example (Example 2) of the present invention.
Figure 9E:
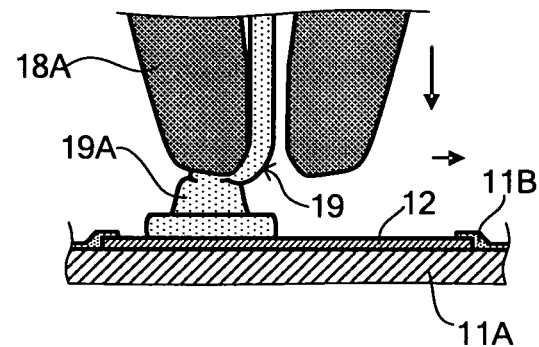
FIG. 9E is a fifth cross-sectional view for explaining the example of the bump formation step in the manufacturing method for the semiconductor device of the Second Example (Example 2) of the present invention.
Figure 9F:
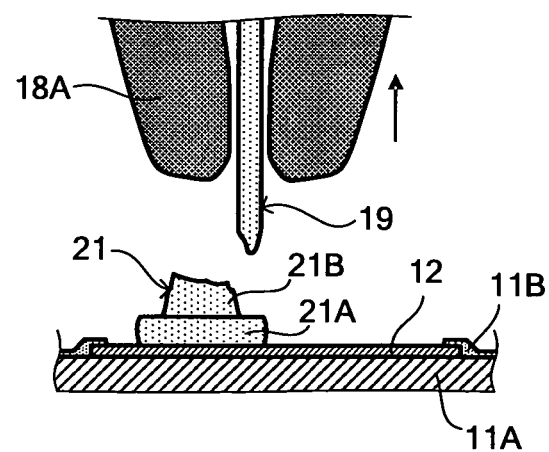
FIG. 9F is a sixth cross-sectional view for explaining the example of the bump formation step in the manufacturing method for the semiconductor device of the Second Example (Example 2) of the present invention.
Figure 9G:
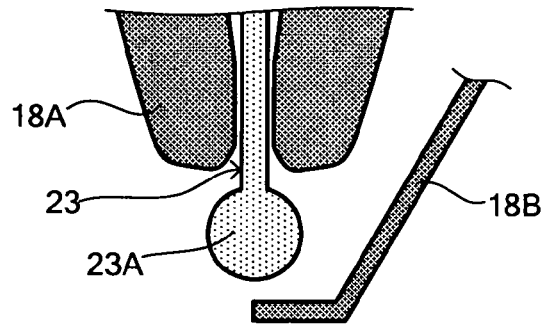
FIG. 9G is a seventh cross-sectional view for explaining the example of the bump formation step in the manufacturing method for the semiconductor device of the Second Example (Example 2) of the present invention.
Figure 9H:
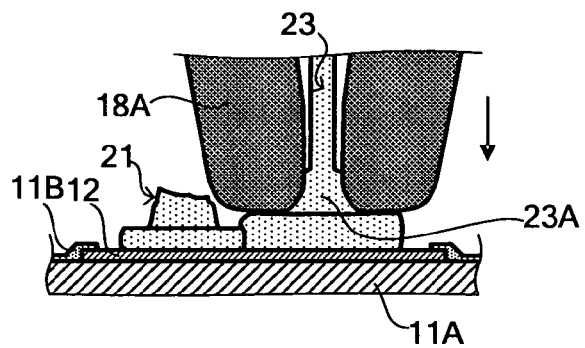
FIG. 9H is an eighth cross-sectional view for explaining the example of the bump formation step in the manufacturing method for the semiconductor device of the Second Example (Example 2) of the present invention.
Figure 9I:
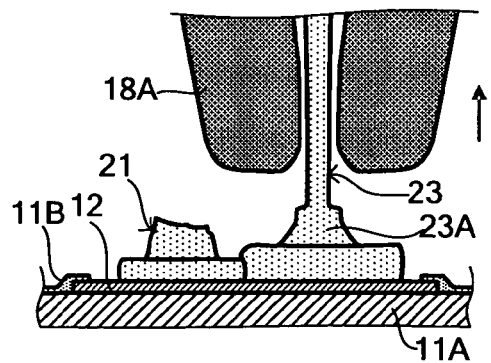
FIG. 9I is a ninth cross-sectional view for explaining the example of the bump formation step in the manufacturing method for the semiconductor device of the Second Example (Example 2) of the present invention.
Figure 9J:
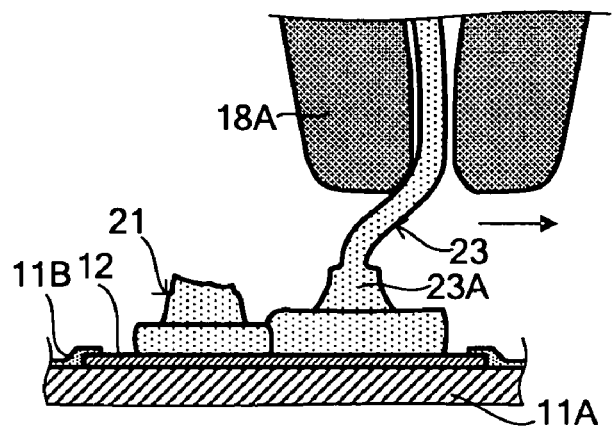
FIG. 9J is a tenth cross-sectional view for explaining the example of the bump formation step in the manufacturing method for the semiconductor device of the Second Example (Example 2) of the present invention.
Figure 9K:
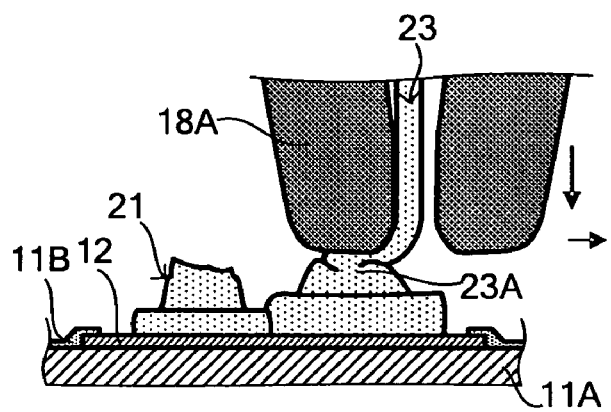
FIG. 9K is an eleventh cross-sectional view for explaining the example of the bump formation step in the manufacturing method for the semiconductor device of the Second Example (Example 2) of the present invention.
Figure 9L:
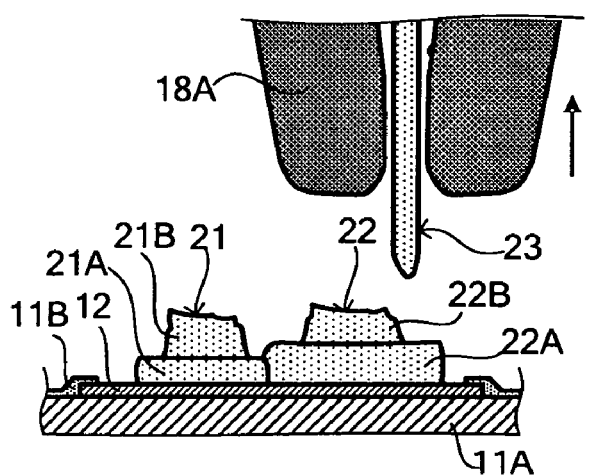
FIG. 9L is a twelfth cross-sectional view for explaining the example of the bump formation step in the manufacturing method for the semiconductor device of the Second Example (Example 2) of the present invention.

The bumps 21 and 22 can be formed through a ball bonding process using a metal wire. As shown in FIG. 9A, the tip of the metal wire 19 of 18 μm in diameter, which is extended out of the bonding capillary 18A, is melted into a ball shape by the application of high-voltage spark using the torch electrode 18B, thereby forming a ball part 19A. As shown in FIG. 9B, the ball part 19A is then brought in contact with an electrode pad 12 at the opening of the surface protective layer 11B, followed by application of a load and ultrasonic to the ball part 19A by means of the bonding capillary 18A. After vertically lifting the bonding capillary 18A as shown in FIG. 9C, the bonding capillary 18A is moved in a direction horizontal to the surface of the semiconductor substrate 11A as shown in FIG. 9D. The top of the ball part 19A is then crushed by the bonding capillary 18A as shown in FIG. 9E, and the bonding capillary 18A is again moved in a direction horizontal to the surface of the semiconductor substrate 11A. As shown in FIG. 9F, the bonding capillary 18A is vertically lifted to break the metal wire 23, forming the first bump 21 which is composed of the base part 21A and protruding part 21B. Subsequently, a metal wire 23 of 20 μm in diameter, which is larger in diameter than the previous one, is used to form a ball part 23A at the tip of the metal wire 23 as shown in FIG. 9G and, as shown in FIG. 9H, is placed on the electrode pad 12 in such a way as to be partially in contact with the perimeter of the base part 21A of the first bump 21. After vertically lifting the bonding capillary 18A as shown in FIG. 9I, the bonding capillary 18A is moved in a direction horizontal to the surface of the semiconductor substrate 11A as shown in FIG. 9J. The top of the ball part 23A is then crushed by the bonding capillary 18A as shown in FIG. 9K and, as shown in FIG. 9L, the bonding capillary 18A is vertically lifted to break the metal wire 23, forming the second bump 22 which is composed of the base part 22A and protruding part 22B. In this way two different bumps 21 and 22 can be obtained that are arranged in a layout shown in FIGS. 8A and 8B.

Figure 10:
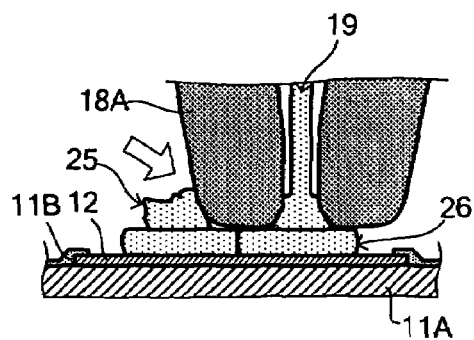
FIG. 10 is a schematic view for explaining a bump formation failure.

Upon formation of two bumps 25 and 26 having base parts of equal height as shown in FIG. 10, the tip of the bonding capillary 18A may interfere with the previously formed bump 25 when forming the second bump, or the bump 26, causing peeling off of the bump 26 from the electrode 12. In Example 2, by contrast, the base part 21A of the bump 21 differs from the base part 22A of the bump 22 in height (the base part 22A is higher than the base part 21A in Example 2). For this reason, in Example 2, it is possible to form the bump 22 without interference of the bonding capillary 18A with the bump 21 previously formed. Thus, it is possible to prevent the bump 21 or 22 from being peeled off the electrode pad and thus to secure such bumps to the electrode pads with reliability, increasing products yields and improving the reliability of the resultant semiconductor device 20.

Note that upon formation of the second bump or bump 22, the base part 22A can also be made higher than the base part 21A of the first bump or bump 21 by forming the bump 22 under bonding conditions different from those for the bump 21—for example, by making the load or ultrasonic output for the bump 22 small compared to that for the bump 21—instead of using a wire of different diameter as demonstrated above.

Example 3

Figure 11:
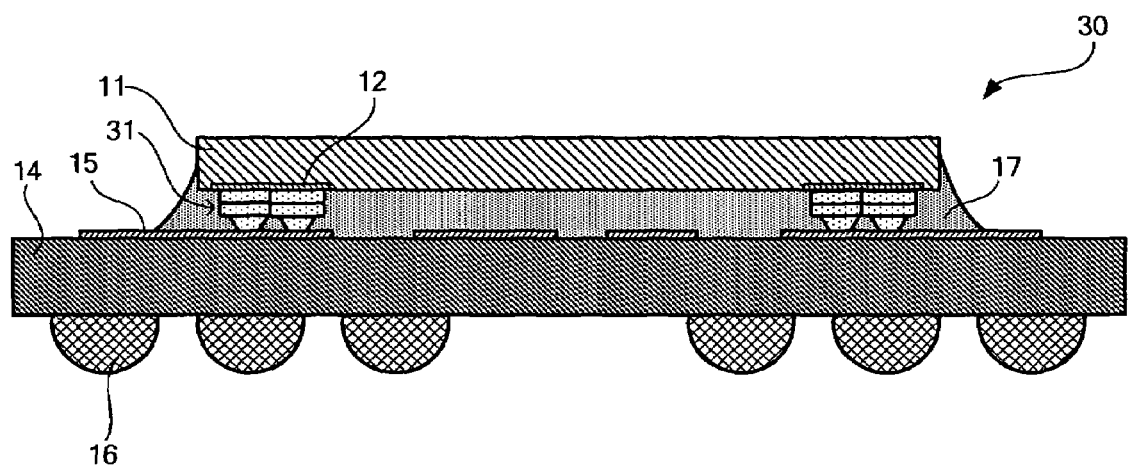
FIG. 11 is a vertical cross-sectional view of an example of the semiconductor device of the present invention, showing the third Example (Example 3).

The Third Example of the semiconductor device of the present invention is shown in FIG. 11, which is a vertical cross-sectional view of the semiconductor device.

A semiconductor device 30 shown in FIG. 11 is the semiconductor device 10 shown in FIG. 1, where the base part of each of the two bumps formed on the electrode pad 12 is of multiple stages.

Figure 12A:
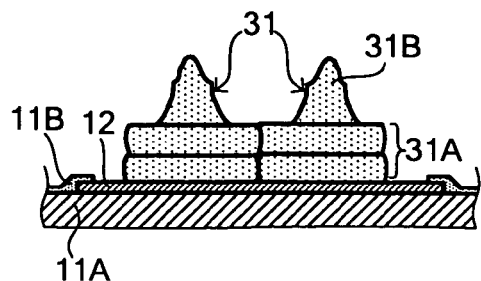
FIG. 12A is an enlarged vertical cross-sectional view of the vicinities of bumps used in the Third Example (Example 3) of the semiconductor device of the present invention.
Figure 12B:
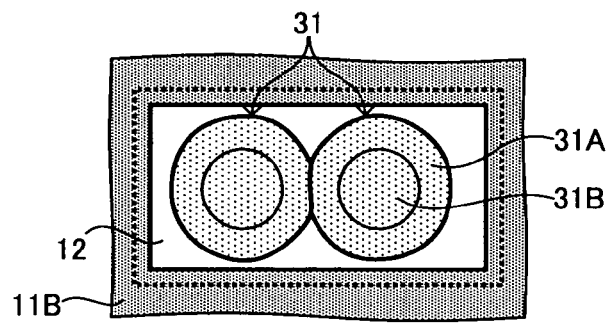
FIG. 12B is an enlarged top view of the vicinities of bumps used in the Third Example (Example 3) of the semiconductor device of the present invention.

The enlarged view of the vicinities of the bumps used in the semiconductor device 30 shown in FIG. 11, and the top view thereof are shown in FIGS. 12A and 12B, respectively. As shown in FIG. 12A, two bumps 31 are formed in the opening of the surface protective layer 11B of an electrode pad 12 which is formed on a semiconductor substrate 11A such as a silicon substrate. Note in FIG. 12A that other layers provided on the semiconductor substrate 11A, such as a conductive layer and insulating layer, are not shown.

As shown in FIGS. 12A and 12B, each bump 31 is composed of a base part 31A and a protruding part 31B which is smaller in diameter than the base part 31A, and the base part 31A is of two stages. The bumps 31 are so formed that the respective base parts 31A are in contact with each other.

Note that although each of the base parts 31A is of two stages, the number of stages is not particularly limited and can be appropriately determined depending on the intended purpose.

Because the base part 31A of each bump 31 is of multiple stages in Example 3 (two stages in Example 3), the overall height of the bumps 31 can be made large enough to keep the semiconductor chip 11 and the substrate 14 apart at a given distance for keeping them from contact with each other. Thus, when the adhesive 17 is placed between the semiconductor chip 11 and the substrate 14 for the mounting of the semiconductor chip 11 on the substrate 14, the adhesive 17 can readily flow over the entire surface of the semiconductor chip 11, reducing the likelihood of problems associated with this—for example the generation of spaces in the clearance that are not filled with the adhesive 17, or the occurrence of voids in the adhesive 17. Thus, fine electrode pad 12 pitch can be readily achieved in the semiconductor device 11.

When an adhesive member such as solder or a conductive adhesive is used for the connection of the bumps 31 to the electrode terminals 15 of the substrate 14, the occupied volume of such an adhesive member covering the bumps 31 can be increased, making it possible to disperse stress concentration exerted on the bump connection more efficiently and to thereby further increase the connection reliability.

Figure 13A:
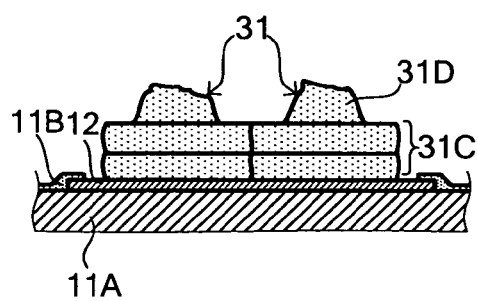
FIG. 13A is a vertical cross-sectional view of a modified example of the vicinities of bumps used in the Third Example (Example 3) of the semiconductor device of the present invention.
Figure 13B:
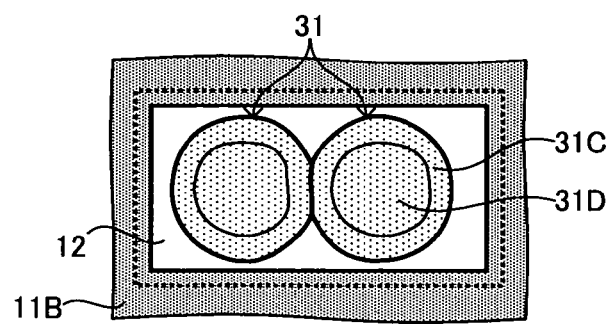
FIG. 13B is a top view of the modified example of the vicinities of bumps used in the Third Example (Example 3) of the semiconductor device of the present invention.

A further modification can be made to the bumps 31 of the semiconductor device 30 of Example 3, as will be demonstrated below. As shown in FIG. 13A, the top of the protruding part 31D of the bump 31 may be crushed so that its diameter is greater than that of the protruding part 31B of the bump 31 shown in FIG. 12B, as shown in FIG. 13B.

Figure 14A:
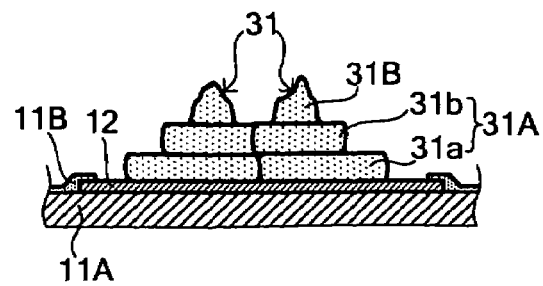
FIG. 14A is a vertical cross-sectional view of another modified example of the vicinities of bumps used in the Third Example (Example 3) of the semiconductor device of the present invention.
Figure 14B:
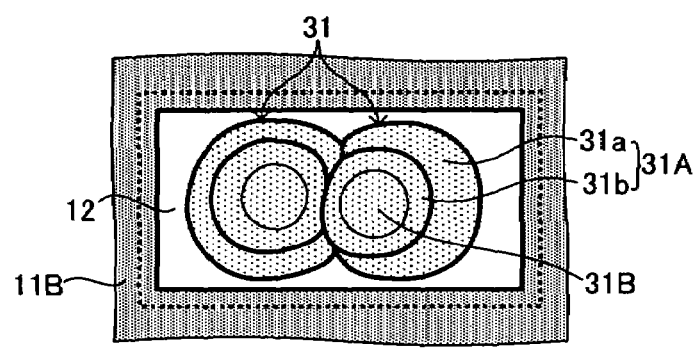
FIG. 14B is a top view of another modified example of the vicinities of bumps used in the Third Example (Example 3) of the semiconductor device of the present invention.
Figure 14C:
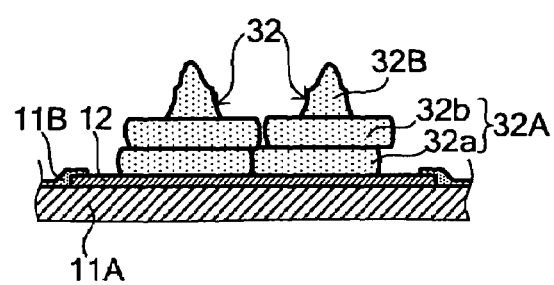
FIG. 14C is an enlarged vertical cross-sectional view of the vicinities of bumps after the occurrence of a bump formation failure.
Figure 14D:
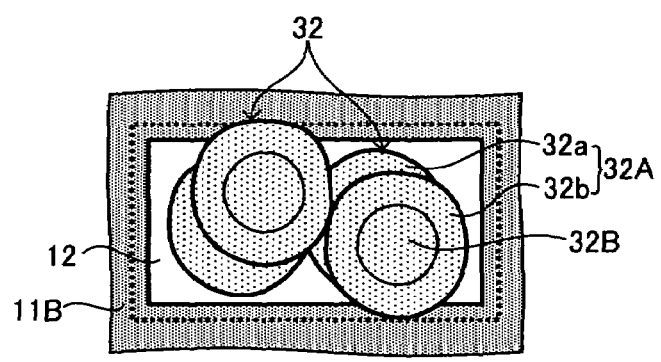
FIG. 14D is an enlarged top view of the vicinities of bumps after the occurrence of the bump formation failure.

As shown in FIG. 14A, it is preferable that the two bumps 31 be so formed that the diameter of the upper base part 31b of each of the two-staged base parts 31A is smaller than that of its lower base part 31a and that the respective base parts 31a and base parts 31b are in contact with each other, respectively. For example, as shown in FIGS. 14C and 14D, when the base parts 32A of the bumps 32—each composed of the base part 32A and the protruding part 32B—is composed of two stages of equal diameter, the position where the upper base part 32b is formed deviates from the position where the lower base part 32a is formed, causing the risk of a short circuit with bumps formed on adjacent electrode pads in some cases. To avoid this problem, the diameter of the upper base part 31b is made smaller than that of the lower base part 31a as shown in FIGS. 14A and 14B. With this configuration it is possible to increase the upper base part 31b deviation tolerance and to increase the product yields.

The method for forming the bumps 31 is not particularly limited and can be appropriately determined depending on the intended purpose; the foregoing ball bonding process using a metal wire can be suitably employed. Upon formation of the bumps 31 shown in FIGS. 14A and 14B, the diameter of a metal wire used for the formation of the upper base parts 31b can be set smaller than that of a metal wire used for the formation of the lower base parts 31a. Alternatively, the bonding conditions under which the upper base parts 31b are formed may differ from those for the lower base parts 31a— for example the load or ultrasonic output applied for the formation of the upper base parts 31b may be made small compared to that for the lower base parts 31a.

Example 4

The Fourth Example of the semiconductor device of the present invention is shown in FIGS. 15A to 15D. These drawings are top views of a semiconductor chip on which electrode pads are formed, each showing an example of the layout of electrode pads having bumps formed thereon.

Figure 15A:
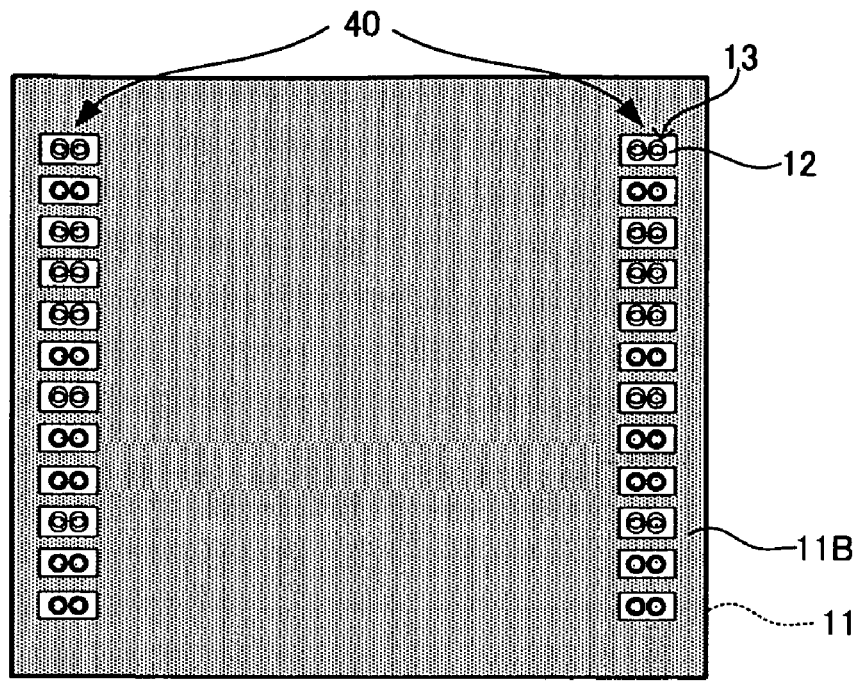
FIG. 15A is a top view of an example of the layout of electrode pads formed on a semiconductor chip used in the Fourth Example (Example 4) of the semiconductor device of the present invention.
Figure 15B:
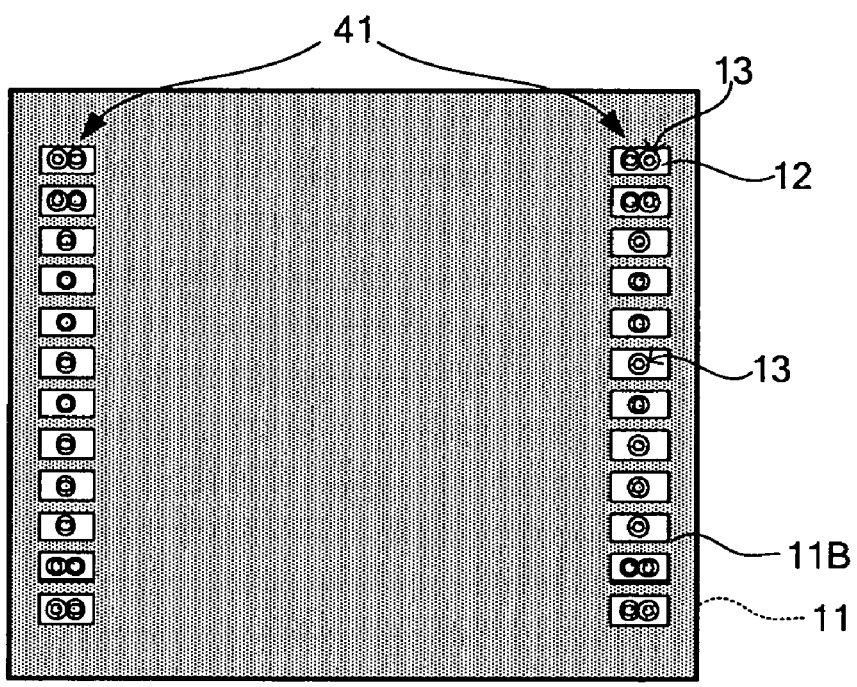
FIG. 15B is a top view of another example of the layout of electrode pads formed on the semiconductor chip used in the Fourth Example (Example 4) of the semiconductor device of the present invention.
Figure 15C:
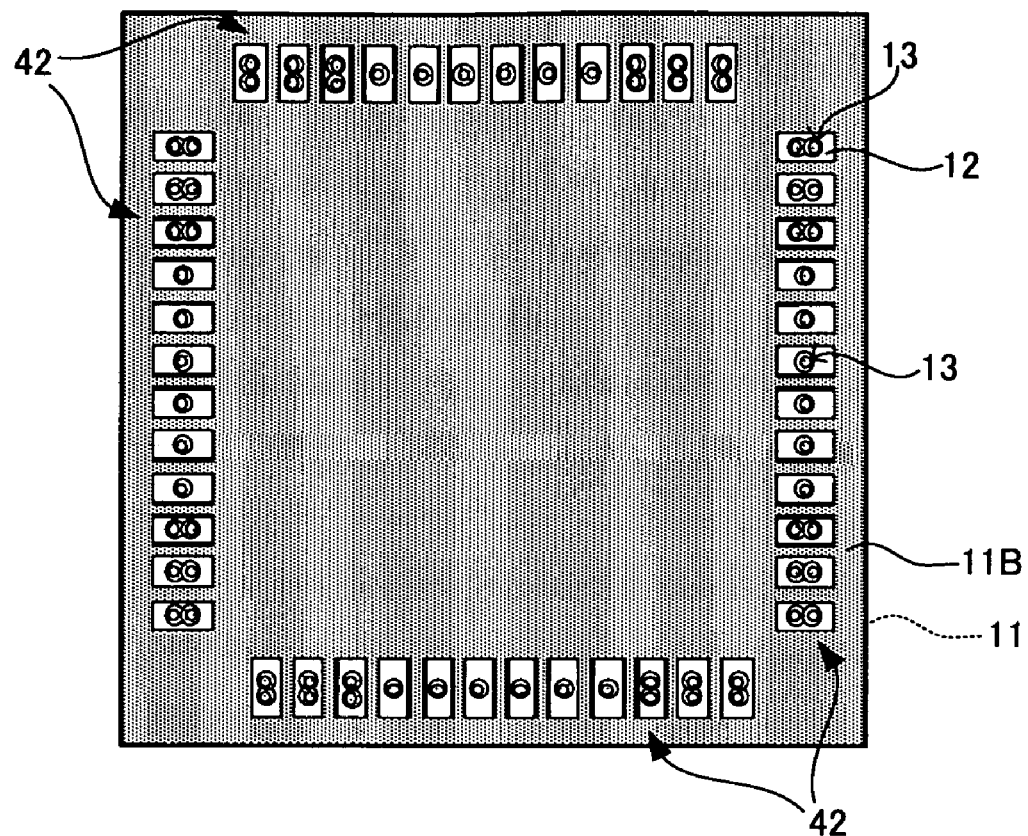
FIG. 15C is a top view of still another example of the layout of electrode pads formed on the semiconductor chip used in the Fourth Example (Example 4) of the semiconductor device of the present invention.
Figure 15D:
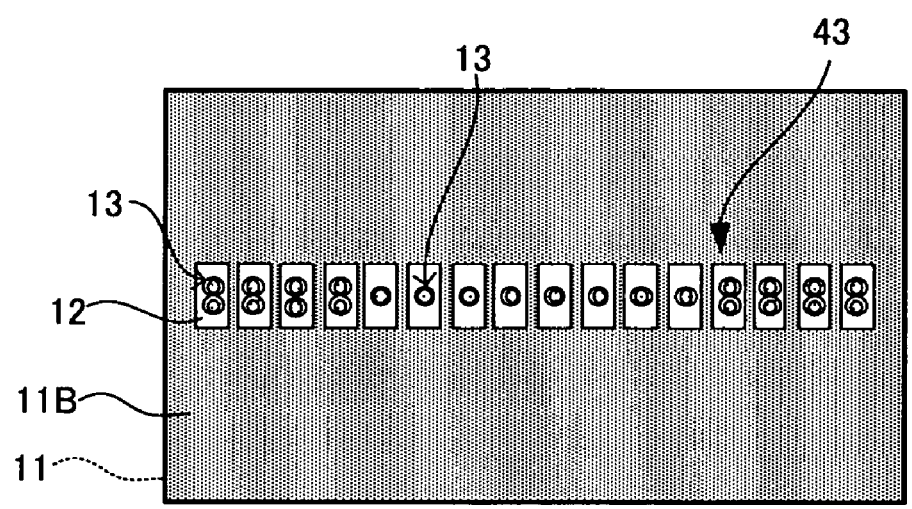
FIG. 15D is a top view of yet another example of the layout of electrode pads formed on the semiconductor chip used in the Fourth Example (Example 4) of the semiconductor device of the present invention.

FIGS. 15A and 15B each shows a semiconductor chip 11 with two peripheral rows of electrode pads 12, FIG. 15C shows a semiconductor chip 11 with four peripheral rows of electrode pads 12, and FIG. 15D shows a semiconductor chip 11 with a center row of electrode pads 12. In each case two bumps, each composed of a base part and a protruding part which is smaller in diameter than the base part, are formed on at least the electrode pads 12 positioned at the ends of each pad row, and the base parts of them are in contact with each other.

More specifically, in FIG. 15A, two pad rows 40, each consisting of a plurality of electrode pads 12, are arranged along either sides of the semiconductor chip 11, and two bumps 13 prepared in Example 1, each composed of the base part 13A and the protruding part 13B, are formed on each of the electrode pads 12 in such a way that the respective base parts 13A are in contact with each other. Similarly, in FIG. 15B, two pad rows 41, each consisting of a plurality of electrode pads 12, are arranged along either sides of the semiconductor chip 11, and two bumps 13 prepared in Example 1, each composed of the base part 13A and the protruding part 13B, are formed on each of the two electrode pads 12 from both ends of each of the pad rows 41 in such a way that the respective base parts 13A are in contact with each other. On the other hand, each of the other electrode pads 12 of each pad row 41, including the center of the pad row 41, is provided with one bump 13.

In FIG. 15C four pad rows 42, each consisting of a plurality of electrode pads 12, are arranged around the perimeter of the semiconductor chip 11, and two bumps 13 prepared in Example 1, each composed of the base part 13A and the protruding part 13B, are formed on each of the three electrode pads 12 from both ends of each of the pad rows 42 in such a way that the respective base parts 13A are in contact with each other. On the other hand, each of the other electrode pads 12 of each pad row 42, including the center of the pad row 42, is provided with one bump 13.

In FIG. 15D a pad row 43 consisting of a plurality of electrode pads 12 is arranged across the semiconductor chip 11 at the center, and two bumps 13 prepared in Example 1, each composed of the base part 13A and the protruding part 13B, are formed on each of the four electrode pads 12 from both ends of the pad row 43 in such a way that the respective base parts 13A are in contact with each other. On the other hand, each of the other electrode pads 12 of the pad row 43, including the center of the pad row 43, is provided with one bump 13.

Note that the pad row layout, and the size and number of the bumps formed on each electrode pad are not limited to those shown in FIGS. 15A to 15D, and can be appropriately determined depending on the intended purpose.

When an adhesive is charged between a semiconductor chip and a substrate for mounting the semiconductor chip on the substrate, the adhesive flows over the entire surface of the semiconductor chip and pushes out air bubbles. However, since such air bubbles tend to be entrapped at positions close to the perimeter of the semiconductor chip, there is a problem that it is likely that air bubbles are generated at the connections of bumps that are formed at the ends of the electrode pad row(s) arranged near the perimeter of the semiconductor chip. The semiconductor device of Example 4, however, can locally prevent the generation of air bubbles without forming a plurality of bumps on every electrode pad, thereby making it possible to provide a high-performance semiconductor device efficiently and inexpensively. Although stress concentration is greater in the connections of bumps positioned at the ends of a pad row than in the connections of bumps positioned at the center of the pad row, these multiple bumps can disperse such stress concentration. For this reason, it is possible to ensure strength of the connections of the bumps positioned at the ends of the pad row and to increase the reliability of a resultant semiconductor device.

Example 5

As an example of the method of the present invention for forming a semiconductor device, the method for forming the semiconductor device 10 of the First Example of the present invention shown in FIG. 1 will be described with reference to the drawings.

Figure 16A:
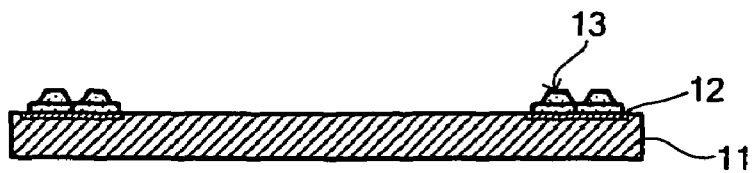
FIG. 16A is a first cross-sectional view for explaining an example of a method of the present invention for manufacturing a semiconductor device.

As shown in FIG. 16A, bumps 13 are first formed on electrode pads 12 that are formed on a semiconductor chip 11. As demonstrated in Example 1, the bumps 13 are formed through a ball bonding process using a metal wire as shown in FIGS. 5A to 5F. This is the bump formation step in the method of the present invention for manufacturing the semiconductor device of the present invention.

Figure 16B:
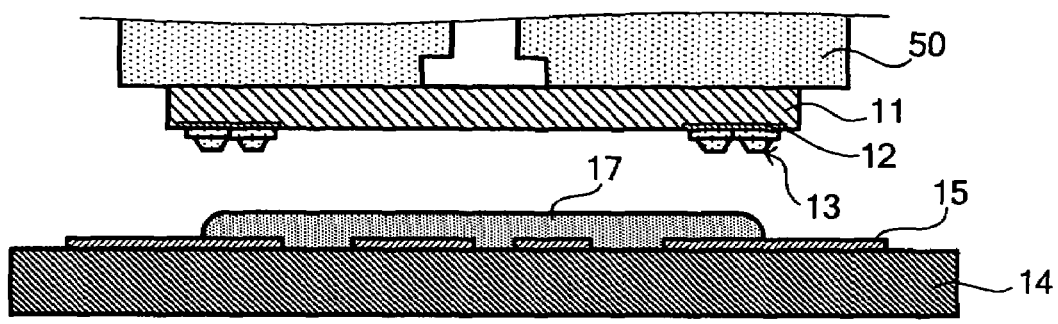
FIG. 16B is a second cross-sectional view for explaining the example of the method of the present invention for manufacturing a semiconductor device.

As shown in FIG. 16B, an adhesive 17 is previously applied on a substrate 14. This is the adhesive supplying step in the method of the present invention.

Figure 16C:
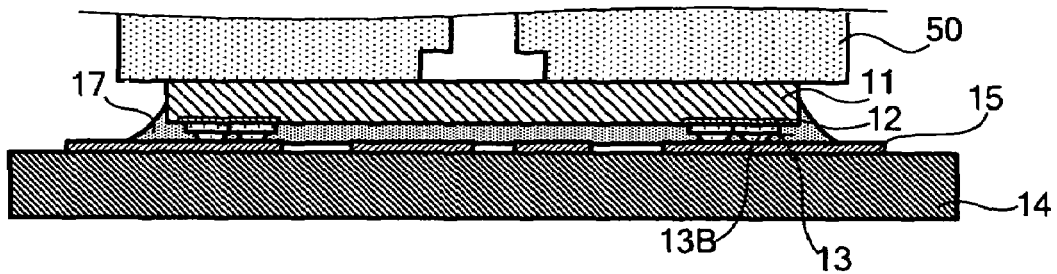
FIG. 16C is a third cross-sectional view for explaining the example of the method of the present invention for manufacturing a semiconductor device.

As shown in FIG. 16B, the substrate 14 is then attached to a bonding stage (not shown) heated to, for example, 70° C. The semiconductor chip 11 is attached to a bonding tool 50, and is horizontally moved for proper alignment with the semiconductor chip 11. At this point, the semiconductor chip 11 is heated by the bonding tool 50 which has been previously heated to a given temperature—for example 215° C. Next, as shown in FIG. 16C, the bonding tool 50 is moved down, allowing the protruding parts 13B of the bumps 13 to contact a plurality of electrode terminals 15 formed on the substrate 14. The bonding tool 50 is further moved down to apply a load on the semiconductor chip 11, deforming the protruding parts 13B of the bumps 13. The bonding tool 50 is kept applying a given pressure (e.g., 78.46 mN to 196.1 mN (8 gf to 20 gf)) for a given period of time (e.g., 5 to 10 seconds). At this point, the adhesive 17 flows over the entire surfaces of the semiconductor chip 11 and the substrate 14, and is cured by heat. Note, however, that the adhesive 17 is not fully cured in such a short period of time. This is the bump connection step in the method of the present invention.

Figure 16D:
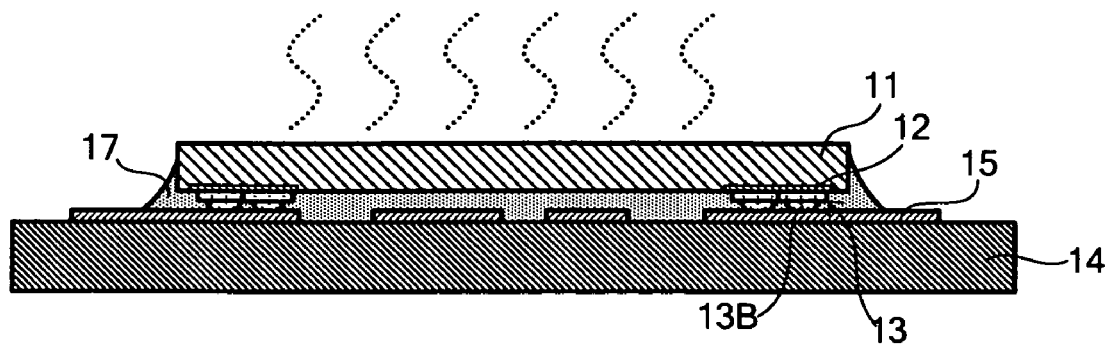
FIG. 16D is a fourth cross-sectional view for explaining the example of the method of the present invention for manufacturing a semiconductor device.

Next, as shown in FIG. 16D, the substrate 14 having the semiconductor chip 11 mounted thereon is preferably placed in a constant-temperature bath for 30 minutes at 150° C. on an as-needed basis for the full curing of the adhesive 17. This is the adhesive curing step in the method of the present invention.

Figure 16E:
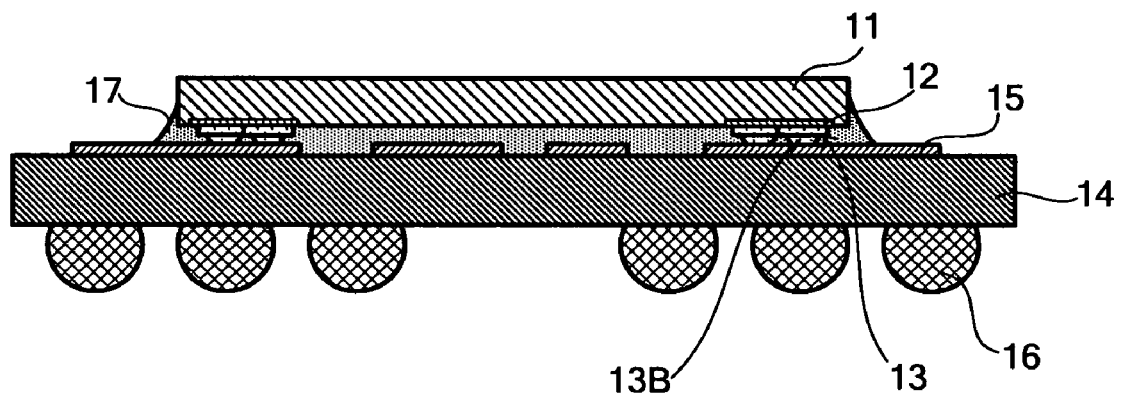
FIG. 16E is a fifth cross-sectional view for explaining the example of the method of the present invention for manufacturing a semiconductor device.

Subsequently, solder balls 16 are formed on the backside of the substrate 14 as shown in FIG. 16E. In this way the semiconductor device 10 shown in FIG. 1 is manufactured.

Although the adhesive supplying step is performed prior to the bump connection step in this Example, the adhesive supplying step may be performed after the bump connection step. In this case, the supply of the adhesive 17 can be carried out by injecting it in the clearance formed between the semiconductor chip 11 and the substrate 14.

When the adhesive supplying step is performed prior to the bump formation step, the adhesive 17 is charged between the semiconductor chip 11 and the substrate 14 before connection of the bumps 13 to the electrical terminals 15, filling the clearance with the adhesive 17 at the same time as the semiconductor chip 11 is flip-chip mounted on the substrate 14. Thus, it is possible to simplify the manufacturing process and to manufacture semiconductor devices inexpensively. In this case, it is more likely that void entrapment takes place between the adjacent bumps 13 in contrast to the case where the bump formation step is followed by the adhesive supplying step. For this reason, void reduction effects of the present invention become prominent in this case.

In addition, the flip chip mounting method is not particularly limited and can be appropriately determined depending on the intended purpose; examples include thermal compression bonding, ultrasonic compression bonding, and bonding methods using an adhesive member.

The thermal compression bonding is a method that involves application of heat and load, as demonstrated in this Example. In a case where the semiconductor chip 11 is to be flip-chip mounted on the substrate 14 with the adhesive 17 being interposed between them by performing the adhesion supplying step prior to the bump connection step, the thermal compression bonding is carried out using an ACF method, ACP method or the like that uses an anisotropic conductive resin adhesive as the adhesive 17. Alternatively, the thermal compression bonding is carried out using a NCF method, NCP method or the like that uses an insulating resin adhesive as the adhesive 17. In a case where the adhesion supplying step is performed after the bump connection step, the thermal compression bonding is carried out by bonding the bumps 13 and the electrode terminals 15 of the substrate 14 together with metals and by injecting the adhesive 17 in the clearance between the semiconductor chip 11 and the substrate 14.

The ultrasonic compression bonding is a method that involves application of ultrasonic and load, or a method that involves application of ultrasonic, load, and heat. Also in this method, the adhesive supplying step may be carried out either after or before the bump connection step.

The bonding method using an adhesive member is a method that involves use of an adhesive member such as solder or a conductive adhesive. Also in this method, the adhesive supplying step may be carried out either after or before the bump connection step.

(Example of a Conventional Semiconductor Device)

Figure 17A:
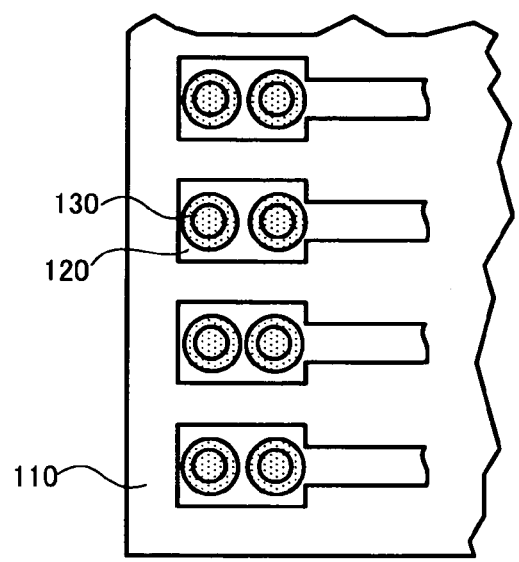
FIG. 17A is a top view of the vicinities of bumps in an example of a conventional semiconductor device.
Figure 17B:
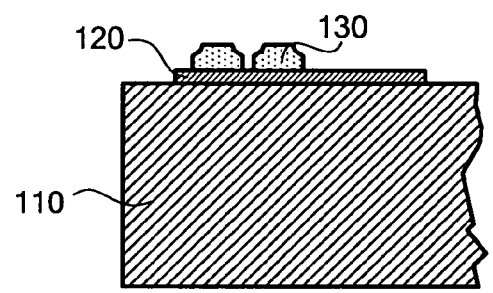
FIG. 17B is a vertical cross-sectional view of the vicinities of bumps in the example of the conventional semiconductor device.
Figure 17C:
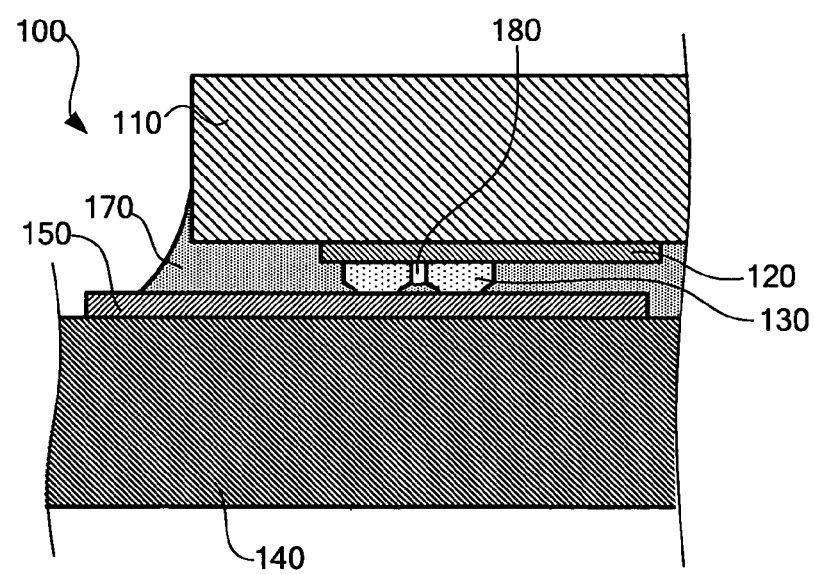
FIG. 17C is a vertical cross-sectional view for explaining a bump formation failure in the example of the conventional semiconductor device.

An example of a layout of bumps in a conventional semiconductor device is shown in FIGS. 17A to 17C.

FIG. 17A is a top view of a layout of bumps 130 formed on electrode pads 120 of a semiconductor chip 110, FIG. 17B is a side view of FIG. 17A, and FIG. 17C is a vertical cross-sectional view of a conventional semiconductor device 100 in which the semiconductor chip 110 is mounted on the substrate 140.

As shown in FIGS. 17A and 17B, two bumps 130 are formed on each of the plurality of electrode pads 120. The two bumps 130 on each electrode pad 120 are separated from each other, and therefore, small space is present between them. For this reason, when the semiconductor chip 110 and the substrate 140 are bonded together with the adhesive 17 while allowing the electrode terminals 150 formed on the substrate 140 to be in contact with the bumps 130 as shown in FIG. 17C, a void (or air bubble) 180 is generated in the space formed between the two bumps 130 in the adhesive 170.

Example 6

Hereinafter, both the semiconductor device of the present invention and a semiconductor device with a conventional bump layout will be evaluated for the incidence of voids (air bubbles) in their adhesive.

First of all, the void generation mechanism will be described with reference to FIGS. 18A and 18B.

Figure 18A:
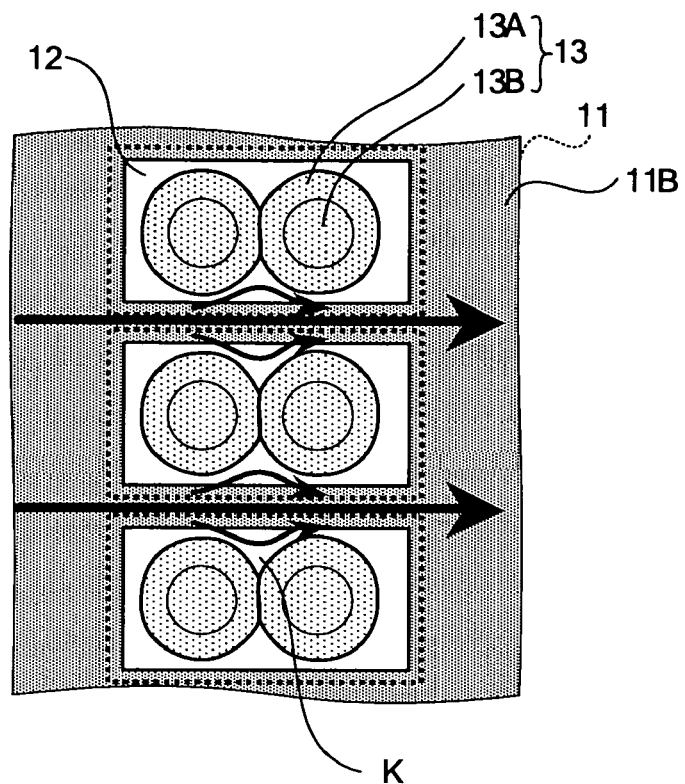
FIG. 18A is a schematic view for explaining the mechanism by which voids are not generated in the semiconductor device of the present invention.

FIG. 18A is a top view of a bump layout of a part of the semiconductor device of the present invention (e.g., the semiconductor device prepared in Example 1).

As shown in FIG. 18A, two bumps 13, each composed of the base part 13A and the protruding part 13B, are formed on each of the electrode pads 12 on the semiconductor chip 11, so that the respective base parts 13A are in contact with each other. FIG. 18B is a top view of an example of a conventional bump layout. As shown in FIG. 18B, the two bumps 13 formed on each of the electrode pads 12 are separated from each other.

Figure 18B:
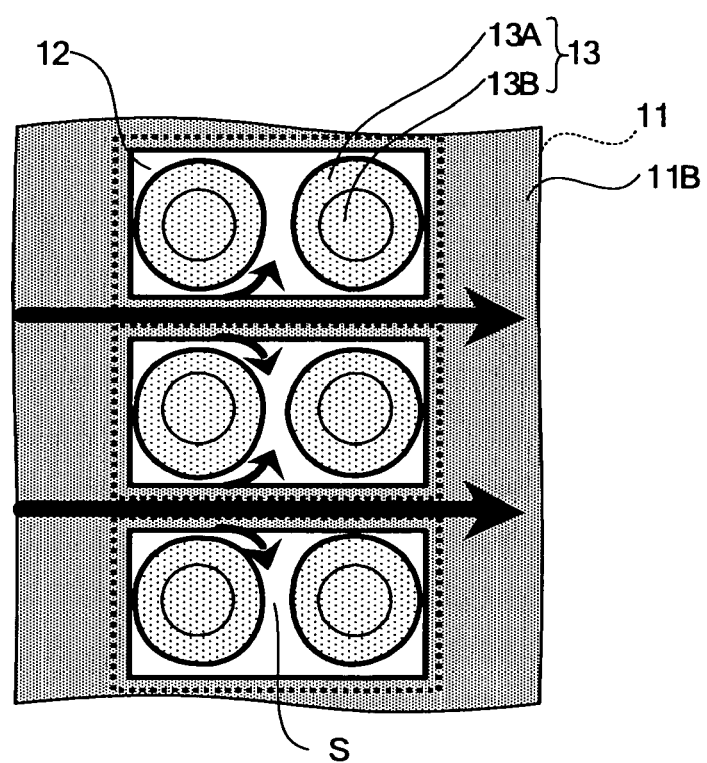
FIG. 18B is a schematic view for explaining the mechanism by which voids are generated in the conventional semiconductor device.

When each semiconductor chip 11 is flip-chip mounted on the substrate 14 in this state, an adhesive flows between the adjacent electrode pads 12 as indicated by thick arrows in the drawings—from the center to the edge of the semiconductor chip 11 (left to right in FIGS. 18A and 18B). At this point, in the conventional bump layout shown in FIG. 18B, space S is formed between the two bumps 13 on each electrode pad 12 because the bumps 13 are separated from each other. When the adhesive flows between the adjacent electrode pads 12, one of the two bumps 13 that is positioned at the center side of the semiconductor chip 11 blocks the flow of the adhesive. The adhesive flows in the spaces S as indicated by thin arrows in FIG. 18B. The flow rate of the adhesive in the spaces S is reduced, allowing air bubbles to be readily generated in the spaces S. These air bubbles remain in the spaces S without being pushed out to the edge of the semiconductor chip 11, leading to formation of voids.

In the bump layout of the present invention shown in FIG. 18A, by contrast, the base parts 13A of the two bumps 13 formed on each electrode 12 are in contact with each other, and therefore, no space is formed between them, thus reducing the likelihood of a reduction in the flow rate of the adhesive (i.e., flow rate reduction is small). Accordingly, as indicated by thin arrows in FIG. 18A, air bubbles are more likely to be pushed out to the edge of the semiconductor chip 11, and air bubbles are less likely to remain in the spaces formed at the constricted portions K of each of the two contacting bumps 13, thereby preventing the generation of voids.

The incidence of air bubbles (voids) inside the adhesive (i.e., the number of voids per total number of electrode pads) was determined in accordance with a procedure described below.

The cross section of the cured adhesive, including the base parts of bumps, was polished to give a flat surface. The polished, flat surface of the cured adhesive was observed using a stereo microscope for the number of voids generated in the vicinities of the bumps. In this way the incidence of voids was evaluated in terms of the total number voids per total number of electrode pads. Five samples were prepared for each of the semiconductor device of Example 1 and a semiconductor device with a conventional bump layout. Note that the semiconductor device of Example 1 was manufactured with the manufacturing method demonstrated in Example 5, which is shown in FIGS. 16A to 16D. These samples were evaluated for the incidence of voids under two different conditions.

<Configuration of Samples>

(1) For Measurement 1

COB (Chip-on-Board) mounting at 50 μm pitch

Chip size: 6.2 mm×6.2 mm×200 μm

Pad pitch: 50 μm

Size of openings for pads in the surface protective layer: 44 μm×94 μm

Number of electrode pads: 392

Substrate: double-sided wiring board made of glass BT (bis-maleimide triazine)

Adhesive: thermosetting insulating epoxy resin in paste form

Wire diameter of a gold wire for bumps: 20 μm (2) For Measurement 2

COC (Chip-on-Chip) mounting at 40 μm pitch

Chip size: 5 mm×3 mm×200 μm

Pad pitch: 40 μm

Size of openings for pads in the surface protective layer: 34 μm×74 μm

Number of electrode pads: 372

Substrate: silicon substrate

Adhesive: thermosetting insulating epoxy resin in paste form

Wire diameter of a gold wire for bumps: 18 μm

<Preparation of Samples>

—Formation of Stud Bumps—

Five samples were prepared for each of the semiconductor device of the present invention and a semiconductor device with a conventional bump layout (hereinafter referred to as a "conventional semiconductor device" in some cases) both for the measurements 1 and 2. Namely, two stud bumps of equal size were formed on every electrode pad of the semiconductor device samples using the formation method shown in FIGS. 5A to 5C (pull-cut method). At this point, in the semiconductor device of the present invention, the two bumps 13 were so formed that the respective base parts 13A are in contact with each other, as shown in FIGS. 2A, 2B and 18A. In the conventional semiconductor device, on the other hand, two bumps 13 were so formed that the respective base parts 13A are separated from each other, as shown in FIG. 18B.

—Bump Shape—

(1) For Measurement 1

The diameter of the base parts is 36 μm to 42 μm, the thickness of the base parts is 14 μm to 16 μm, and the height of the bumps is 35 μm to 41 μm in the semiconductor device of the present invention and the conventional semiconductor device.

In addition, the distance between adjacent bumps, or bump pitch, in the conventional semiconductor device is 10 μm to 20 μm.

(2) For Measurement 2

The diameter of the base parts is 30 μm to 34 μm, the thickness of the base parts is 10 μm to 12 μm, and the height of the bumps is 28 μm to 33 μm in the semiconductor device of the present invention and the conventional semiconductor device.

In addition, the distance between adjacent bumps, or bump pitch, in the conventional semiconductor device is 6 μm to 14 μm.

—Flip Chip Mounting Method—

Adhesive-mediated thermal compression bonding was employed both in the measurements 1 and 2. More specifically, the samples were prepared through the steps shown in FIGS. 16A to 16D.

Table 1 lists the incidences of voids in the measurements 1 and 2, determined by the following equation:

Incidence of voids (%)=number of voids/number of electrode pads

TABLE 1

|  |  | Incidence of voids (%) | | |
|---|---|---|---|---|
|  |  | Average | Max | Min |
| Measurement 1 | Semiconductor device of the present invention | 0.03 | 0.07 | 0.00 |
|  | Conventional semiconductor device | 0.29 | 0.44 | 0.17 |
| Measurement 2 | Semiconductor device of the present invention | 0.01 | 0.02 | 0.00 |
|  | Conventional semiconductor device | 0.21 | 0.25 | 0.16 |

The results shown in Table 1 suggest that while there were few voids in the vicinities of bumps in the semiconductor device of the present invention, the incidence of voids was high in the conventional semiconductor device, leading to a conclusion that the conventional semiconductor device is of poor quality.

In accordance with the procedure described below, the semiconductor device of the present invention and the conventional semiconductor device for the measurements 1 and 2 were then subjected to a moisture absorption/reflow test for the evaluation of their performance.

<Moisture Absorption/Reflow Test>

The semiconductor device of the present invention and the conventional semiconductor device for the measurements 1 and 2 were allowed to stand at 30° C. at relative humidity 80% for 72 hours for the absorption of moisture. Thereafter, using a reflow device, they were subjected to a heating treatment adopting peak temperature of 250° C. This moisture absorption/reflow treatment was performed twice. Five samples were prepared for each of these semiconductor devices, and in accordance with procedures described below, the appearance and interior of each sample were inspected. Moreover, conduction resistance of each sample was also investigated.

—Appearance Inspection—

Using a microscope at 20× magnification, the appearance of each sample was inspected for flaws.

—Interior Inspection—

Using C-SAM (C-mode Scanning Acoustic Microscope), the interior of each sample was inspected for the separation (delamination) between the adhesive and semiconductor chip and between the adhesive and substrate in the semiconductor device.

—Conduction Resistance Investigation—

For the conduction resistance investigation, the semiconductor chip and the substrate which are daisy-chained connected together via bumps were evaluated for the bonding reliability by determining the variations in the values of conduction resistance of the daisy chains. The evaluation criteria are as follows: Samples that showed a 10% increase in the conduction resistance value from the initially assembled state are regarded as faulty.

As a result of these inspections and investigation, no failures were observed in the samples of both the semiconductor device of the present invention and the conventional semiconductor device for the measurements 1 and 2.

Subsequently, a reliability test was performed for the five samples of each of the semiconductor device of the present invention and the conventional semiconductor device, which had been subjected to the foregoing moisture absorption/reflow test.

<Reliability Test>

As a reliability test, a thermal cycling test and constant temperature and humidity test were performed for each sample, followed by an appearance inspection and conduction resistance investigation.

—Thermal Cycling Test—

In the thermal cycling test each sample was alternately placed in two different environments—a low temperature environment of −55° C. for 25 minutes, and a high-temperature environment of 125° C. for 25 minutes.

—Constant Temperature and Humidity Test—

In the constant temperature and humidity test each sample was allowed to stand at 121° C. and at relative humidity 85%.

Next, an appearance inspection and a conduction resistance investigation were made for the semiconductor device samples that had been subjected to the thermal cycling test and constant temperature and humidity test.

—Appearance Inspection—

Using a microscope at 20× magnification, the appearance of each sample was inspected for flaws.

—Conduction Resistance Investigation—

For the conduction resistance investigation, the semiconductor chip and the substrate which are daisy-chained connected together via bumps were evaluated for the bonding reliability by determining the variations in the values of conduction resistance of the daisy chains. The evaluation criteria are as follows: Samples that showed a 10% increase in the conduction resistance value from the initially assembled state are regarded as faulty.

In the thermal cycling test, no failures were observed until 1,750 cycles in the samples of the semiconductor device of the present invention for the measurement 1; until 1,900 cycles in the samples of the semiconductor device of the present invention for the measurement 2; until 1,600 cycles in the samples of the conventional semiconductor device for the measurement 1; and until 1,750 cycles in the samples of the conventional semiconductor device for the measurement 2.

Moreover, in the constant temperature and humidity test, no failures were observed until 672 hours in the samples of the semiconductor device of the present invention for the measurement 1; until 840 hours in the samples of the semiconductor device of the present invention for the measurement 2; until 504 hours in the samples of the conventional semiconductor device for the measurement 1; and until 672 hours in the samples of the conventional semiconductor device for the measurement 2.

Thus, since the conventional semiconductor device entails the generation of voids, the likelihood of the occurrence of electrical continuity failure at the bump connections caused due to bulge and/or peeling off of the adhesive and current leakage between adjacent bumps caused due to moisture and/or impurities (e.g., ions) entrapped in the air bubbles is high in the conventional semiconductor device than in the semiconductor device of the present invention.

According to the present invention, it is possible to solve the foregoing conventional problems and to provide a high-performance, highly-reliable semiconductor device in which an adhesive used to mount (e.g., flip-chip mount) a semiconductor chip on a substrate has less air bubbles therein, and a low-cost, efficient method for manufacturing the semiconductor device.

The semiconductor device of the present invention is of high performance and high reliability because an adhesive used to mount (e.g., flip-chip mount) the semiconductor chip on the substrate has less air bubbles therein, thereby preventing both the occurrence of electrical continuity failure at the bump connections caused due to bulge and/or peeling off of the adhesive and current leakage between adjacent bumps caused due to moisture and/or impurities (e.g., ions) entrapped in the air bubbles.

The method of the present invention for forming a semiconductor device can realize efficient, low-cost manufacturing of a high-performance, highly-reliable semiconductor device in which an adhesive used to mount (e.g., flip-chip mount) a semiconductor chip on a substrate has less air bubbles therein.

What is claimed is:

1. A semiconductor device, comprising:
   a semiconductor chip having a plurality of electrode pads disposed thereon; and
   a substrate having a plurality of electrode terminals at positions corresponding to the electrode pads,
   wherein a plurality of bumps, each including a base part and a protruding part having a diameter smaller than the diameter of the base part, is formed over at least one of the electrode pads in such a way that the respective base parts of the bumps are in contact with each other, and
   wherein the semiconductor chip is bonded to the substrate with an adhesive in a state where the bumps are electrically connected to the electrode terminals.

2. The semiconductor device according to claim 1, wherein a ball bonding process in metal wiring method is used for the formation of the bumps.

3. The semiconductor device according to claim 1, wherein the height of the base part of at least one of the plurality of bumps is different from the height of the base part(s) of the bump(s) positioned adjacent to the bump.

4. The semiconductor device according to claim 1, wherein the base part of each of the bumps includes multiple stages.

5. The semiconductor device according to claim 4, wherein the base part of each of the bumps is composed of two stages.

6. The semiconductor device according to claim 4, wherein the diameter of the uppermost stage of the base part is smaller than the diameter of the stage(s) below the uppermost stage.

7. The semiconductor device according to claim 1, wherein the electrode pads are arranged in a row to form a pad row, and wherein the plurality of bumps, each including the base part and the protruding part having a diameter smaller than the diameter of the base part, is formed over at least the electrode pads positioned at the ends of the pad row in such a way that the respective base parts are in contact with each other.

8. The semiconductor device according to claim 7, wherein the ends of the pad row is in the vicinity of the perimeter of the semiconductor chip.

* * * * *